US012426457B2

(12) United States Patent
Wei et al.

(10) Patent No.: US 12,426,457 B2
(45) Date of Patent: Sep. 23, 2025

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Feng Wei, Beijing (CN); Hongjun Zhou, Beijing (CN); Lili Du, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 743 days.

(21) Appl. No.: 17/636,077

(22) PCT Filed: Mar. 26, 2021

(86) PCT No.: PCT/CN2021/083330
§ 371 (c)(1),
(2) Date: Feb. 17, 2022

(87) PCT Pub. No.: WO2022/198650
PCT Pub. Date: Sep. 29, 2022

(65) Prior Publication Data
US 2023/0345772 A1    Oct. 26, 2023

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/122* (2023.02);
(Continued)

(58) Field of Classification Search
CPC . H10K 59/124; H10K 59/1201; H10K 59/122
(Continued)

(56) References Cited

U.S. PATENT DOCUMENTS

2020/0052050 A1* 2/2020 Jiang .................... H10K 50/844

* cited by examiner

*Primary Examiner* — Ori Nadav
(74) *Attorney, Agent, or Firm* — Dilworth & Barrese, LLP.; Michael J. Musella, Esq.

(57) ABSTRACT

A display substrate and a manufacturing method thereof, and a display device are provided. The display substrate has a display region and an electrode opening region, the display region includes a first electrode layer and a spacer layer on a base substrate; the electrode opening region includes a third electrode layer and a spaced insulating layer on the base substrate, the third electrode layer includes a plurality of electrode openings, the spaced insulating layer includes a plurality of insulating patterns, each insulating pattern fills a corresponding electrode opening; a maximum distance between a side of the spaced insulating layer away from the base substrate and the base substrate is a first distance, a maximum distance between a side of the spacer layer away from the base substrate and the base substrate is a second distance, a ratio of the first distance to the second distance ranges from 0.9 to 1.1.

16 Claims, 13 Drawing Sheets

(51) Int. Cl.
*H10K 59/122* (2023.01)
*H10K 59/124* (2023.01)
*H10K 59/80* (2023.01)
*H10K 71/00* (2023.01)

(52) U.S. Cl.
CPC ....... *H10K 59/124* (2023.02); *H10K 59/8723* (2023.02); *H10K 59/873* (2023.02); *H10K 71/00* (2023.02)

(58) Field of Classification Search
USPC .......................................................... 257/72
See application file for complete search history.

DISPLAY SUBSTRATE AND MANUFACTURING METHOD THEREOF, AND DISPLAY DEVICE

TECHNICAL FIELD

Embodiments of the present disclosure relate to a display substrate and a manufacturing method thereof, and a display device.

BACKGROUND

Wearable display devices, such as a watch, a wristband, or the like, usually have different sizes and different application scenarios from traditional display devices such as a mobile phone, a tablet computer, or the like, and therefore usually have different structures and manufacturing process from traditional display devices to adapt to different needs.

SUMMARY

At least one embodiment of the present disclosure provides a display substrate, the display substrate comprises a base substrate and has a display region, an encapsulation region surrounding the display region, and an electrode opening region between the display region and the encapsulation region, the display region comprises a pixel driving circuit on the base substrate, and comprises a first planarization layer, a first electrode layer, a pixel definition layer, a spacer layer, a light-emitting layer, and a second electrode layer which are on a side of the pixel driving circuit away from the base substrate and are sequentially arranged along a direction away from the base substrate, the first electrode layer comprises a plurality of first electrodes, the pixel definition layer comprises a plurality of sub-pixel openings, and each of the plurality of sub-pixel openings exposes one first electrode; the electrode opening region comprises a second planarization layer, a third electrode layer, and a spaced insulating layer which are sequentially arranged along the direction away from the base substrate, the third electrode layer comprises a plurality of electrode openings spaced apart from each other, the spaced insulating layer comprises a plurality of insulating patterns spaced apart from each other, each of the plurality of insulating patterns fills a corresponding electrode opening, and an orthographic projection of the each of the plurality of insulating patterns on the base substrate covers an orthographic projection of the corresponding electrode opening on the base substrate; and a maximum distance between a side of the spaced insulating layer away from the base substrate and the base substrate is a first distance, a maximum distance between a side of the spacer layer away from the base substrate and the base substrate is a second distance, and a ratio of the first distance to the second distance ranges from 0.9 to 1.1.

For example, in the display substrate provided by at least one embodiment of the present disclosure, the spaced insulating layer comprises a first layer and a second layer which are sequentially arranged along the direction away from the base substrate, and with respect to the base substrate, at least one layer of the spaced insulating layer is in a same layer as the spacer layer.

For example, in the display substrate provided by at least one embodiment of the present disclosure, the at least one layer of the spaced insulating layer being in the same layer as the spacer layer comprises: both the first layer and the second layer being in a same layer as the spacer layer; or the first layer being in a same layer as the pixel definition layer, and the second layer being in a same layer as the spacer layer.

For example, in the display substrate provided by at least one embodiment of the present disclosure, the electrode opening region further comprises a gate driving circuit on a side of the second planarization layer close to the base substrate, the plurality of electrode openings expose the second planarization layer.

For example, in the display substrate provided by at least one embodiment of the present disclosure, the second electrode layer is continuously provided in the display region and extends from the display region to the electrode opening region, and the second electrode layer is connected to the third electrode layer through a gap between the plurality of insulating patterns in the electrode opening region.

For example, in the display substrate provided by at least one embodiment of the present disclosure, the electrode opening region further comprises a VSS power line on the base substrate, and the third electrode layer extends to a side of the VSS power line away from the base substrate to be connected to the VSS power line.

For example, in the display substrate provided by at least one embodiment of the present disclosure, the VSS power line is in a same layer as part of circuits of the gate driving circuit, and is on a side of the gate driving circuit away from the display region.

For example, in the display substrate provided by at least one embodiment of the present disclosure, the spacer layer comprises a plurality of spacers arranged in an array in the display region; and heights of the plurality of insulating patterns in the spaced insulating layer and the plurality of spacers in the spacer layer in a direction perpendicular to the base substrate range from 1.5 μm to 2.5 μm.

For example, in the display substrate provided by at least one embodiment of the present disclosure, the third electrode layer of the electrode opening region comprises a plurality of columns of electrode openings on a side close to the display region, the pixel definition layer extends to the electrode opening region and covers a part of the third electrode layer and at least one column of electrode openings in the plurality of columns of electrode openings, and the light-emitting layer is on a side of a part of the pixel definition layer in the electrode opening region away from the base substrate.

For example, in the display substrate provided by at least one embodiment of the present disclosure, sizes and shapes of the plurality of insulating patterns on a side of the pixel definition layer covering the third electrode layer away from the base substrate are identical to sizes and shapes of the plurality of spacers in the display region, and sizes and shapes of the plurality of insulating patterns on other columns of electrode openings not covered by the pixel definition layer are different from the sizes and the shapes of the plurality of spacers in the display region.

For example, in the display substrate provided by at least one embodiment of the present disclosure, in a column direction, the sizes of the plurality of insulating patterns on the other columns of electrode openings not covered by the pixel definition layer are larger than the sizes of the plurality of spacers in the display region, and in the column direction, a distance between two adjacent insulating patterns in the plurality of insulating patterns on the other columns of electrode openings not covered by the pixel definition layer is smaller than a distance between two adjacent spacers in the plurality of spacers in the display region.

For example, in the display substrate provided by at least one embodiment of the present disclosure, at an edge of the electrode opening region close to the encapsulation region, the pixel definition layer comprises an elongated portion, and the third electrode layer is covered by the elongated portion.

For example, in the display substrate provided by at least one embodiment of the present disclosure, an angle of a tangent of a side surface of each of the plurality of insulating patterns between a surface of the each of the plurality of insulating patterns close to the base substrate and a surface of the each of the plurality of insulating patterns away from the base substrate, and a plane parallel to the base substrate ranges from 10° to 60°.

For example, in the display substrate provided by at least one embodiment of the present disclosure, the encapsulation region comprises an encapsulation base, an interlayer insulating layer, and an encapsulation glue which are sequentially arranged along the direction away from the base substrate.

For example, in the display substrate provided by at least one embodiment of the present disclosure, a material of the encapsulation base comprises metal, the encapsulation base is in a first gate metal layer and comprises a plurality of first openings spaced apart from each other, the interlayer insulating layer comprises a plurality of groups of second openings, and each of the plurality of groups of second openings comprises a plurality of second openings spaced apart from each other.

For example, in the display substrate provided by at least one embodiment of the present disclosure, an orthographic projection of each of the plurality of groups of second openings on the base substrate is within a range of an orthographic projection of a corresponding first opening on the base substrate, and the encapsulation glue is in the plurality of first openings and the plurality of second openings.

For example, in the display substrate provided by at least one embodiment of the present disclosure, a plurality of protrusions spaced apart from each other are provided on an edge of the encapsulation base close to the electrode opening region, and the plurality of protrusions are connected to the VSS power line through vias in the interlayer insulating layer.

For example, in the display substrate provided by at least one embodiment of the present disclosure, a ratio of a distance, between a surface of the encapsulation glue away from the base substrate and the base substrate, to a distance, between a surface of the plurality of insulating patterns in the spaced insulating layer away from the base substrate and the base substrate, ranges from 1.2 to 0.8.

At least one embodiment of the present disclosure provides a display device, the display device comprises the display substrate provided by embodiments of the present disclosure.

At least one embodiment of the present disclosure provides a manufacturing method of a display substrate, the display substrate has a display region, an encapsulation region surrounding the display region, and an electrode opening region between the display region and the encapsulation region, and the manufacturing method comprises: providing a base substrate; in the display region, forming a pixel driving circuit on the base substrate, and sequentially forming a first planarization layer, a first electrode layer, a pixel definition layer, a spacer layer, a light-emitting layer, and a second electrode layer on a side of the pixel driving circuit away from the base substrate and along a direction away from the base substrate, in which the first electrode layer comprises a plurality of first electrodes, the pixel definition layer comprises a plurality of sub-pixel openings, and each of the plurality of sub-pixel openings exposes one first electrode; and in the electrode opening region, sequentially forming a second planarization layer, a third electrode layer, and a spaced insulating layer along the direction away from the base substrate, in which the third electrode layer comprises a plurality of electrode openings spaced apart from each other, the spaced insulating layer comprises a plurality of insulating patterns spaced apart from each other, each of the plurality of insulating patterns fills a corresponding electrode opening, and an orthographic projection of the each of the plurality of insulating patterns on the base substrate covers an orthographic projection of the corresponding electrode opening on the base substrate, a maximum distance between a side of the spaced insulating layer away from the base substrate and the base substrate is a first distance, a maximum distance between a side of the spacer layer away from the base substrate and the base substrate is a second distance, and a ratio of the first distance to the second distance ranges from 0.9 to 1.1.

For example, in the manufacturing method provided by at least one embodiment of the present disclosure, the spaced insulating layer comprises a first layer and a second layer which are sequentially arranged along the direction away from the base substrate; and with respect to the base substrate, both the first layer and the second layer are formed in a same layer as the spacer layer, or the first layer is formed in a same layer as the pixel definition layer, and the second layer is formed in a same layer as the spacer layer.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In an organic light-emitting diode (OLED) display panel, the light-emitting element used for display includes a cathode, an anode, and an organic light-emitting layer between the cathode and the anode, a metal material for the cathode and the anode, and an organic material for the organic light-emitting layer are usually sensitive to impurities such as water vapor, oxygen, or the like, and if impurities such as water vapor and oxygen penetrate into the light-emitting element, the performance of the light-emitting element would be aged and the service life of the light-emitting element would be shortened. In addition, once the light-emitting element is exposed to water vapor, oxygen, or other impurities, the metal material of the cathode and the anode and the organic material of the organic light-emitting layer may also be oxidized, resulting in defects such as shrinkage (e.g., pixel shrinkage) of the light-emitting region of the display panel, and therefore the display panel needs to be effectively encapsulated during the manufacturing process. At present, the display panel may usually be encapsulated by means of glass frit encapsulation.

Figure 1A:
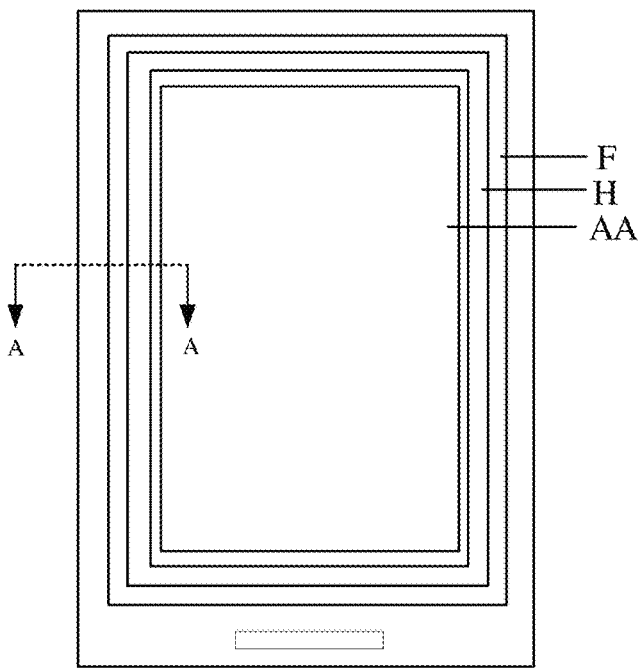
FIG. 1A is a schematic planar diagram of a display substrate.
Figure 1B:
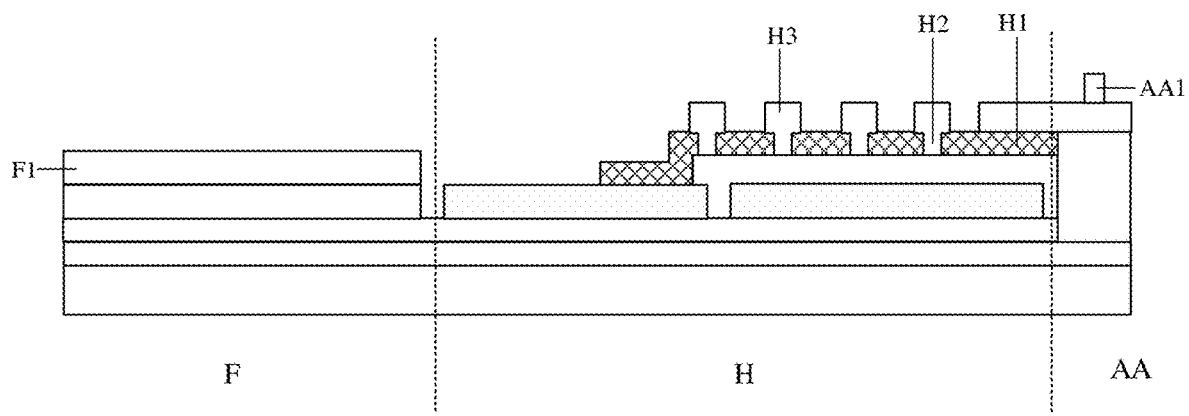
FIG. 1B is a schematic cross-sectional diagram of the display substrate in FIG. 1A along a line A-A.

FIG. 1A shows a schematic planar diagram of a display substrate, and FIG. 1B shows a schematic cross-sectional diagram of the display substrate in FIG. 1A along a line A-A. As illustrated in FIG. 1A and FIG. 1B, the display substrate includes a display region AA, an electrode opening region H, and an encapsulation region F.

For example, the encapsulation region F has a glass sealant (or a frit glue) F1 for combining the display substrate with a cover plate (not shown), so as to form a display panel and implement encapsulation of the display panel. For example, the display region AA has a pixel array and has a spacer AA1 for supporting the mask, so that the mask can be used to form the organic light-emitting layer of the light-emitting element by means of evaporation or the like during the manufacturing process. For example, the electrode opening region H has an electrode layer H1, and the electrode layer H1 has a plurality of electrode openings H2 exposing the insulating layer below the electrode layer H1, so as to discharge impurities such as gas that may be generated in the manufacturing process of the film layer below the electrode layer H1. The electrode openings H2 are filled with insulating patterns H3 to protect the electrode layer H1.

In the manufacturing process of the display substrate, when the organic light-emitting layer is formed by means of evaporation using a mask, the mask can be supported on the glass sealant F1 and the spacer AA1, and in the electrode opening region H, only insulating patterns H3 are provided on the plurality of electrode openings H2. Compared with the spacer AA1 in the display region AA, the electrode opening region H is not provided with a corresponding mask support layer. In this regard, if the heights of the glass sealant F1 and the spacer AA1 are different, when the glass sealant F1 and the spacer AA1 jointly support the mask, the glass sealant F1 will be subjected to uneven force, resulting in defects such as deformation, depression, or the like and causing uneven cell thickness of the display substrate after encapsulation, thereby occurring optical interference and producing interference fringes (Newton rings). At the same time, the mask will also be unevenly stressed in the display region AA, resulting in deformation, thereby resulting in uneven evaporation of the organic light-emitting material, that is, the formed organic light-emitting layer being uneven, which may result in poor display such as color shift.

At least one embodiment of the present disclosure provides a display substrate and a manufacturing method thereof, and a display device. The display substrate includes a base substrate, and has a display region, an encapsulation region surrounding the display region, and an electrode opening region between the display region and the encapsulation region. The display region includes a pixel driving circuit on the base substrate, and includes a first planarization layer, a first electrode layer, a pixel definition layer, a spacer layer, a light-emitting layer, and a second electrode layer which are on a side of the pixel driving circuit away from the base substrate and are sequentially arranged along a direction away from the base substrate, the first electrode layer includes a plurality of first electrodes, the pixel definition layer includes a plurality of sub-pixel openings, and each of the plurality of sub-pixel openings exposes one first electrode. The electrode opening region includes a second planarization layer, a third electrode layer, and a spaced insulating layer which are sequentially arranged along the direction away from the base substrate, the third electrode layer includes a plurality of electrode openings spaced apart from each other, the spaced insulating layer includes a plurality of insulating patterns spaced apart from each other, each of the plurality of insulating patterns fills a corresponding electrode opening, and an orthographic projection of the each of the plurality of insulating patterns on the base substrate covers an orthographic projection of the corresponding electrode opening on the base substrate. A maximum distance between a side of the spaced insulating layer away from the base substrate and the base substrate is a first distance, a maximum distance between a side of the spacer layer away from the base substrate and the base substrate is a second distance, and a ratio of the first distance to the second distance ranges from 0.9 to 1.1.

The display substrate provided by at least one embodiment of the present disclosure has a spaced insulating layer in the electrode opening region, and a ratio of a first distance, between a side of the spaced insulating layer away from the base substrate and the base substrate, to a second distance, between a side of the spacer layer away from the base substrate and the base substrate, is 0.9~1.1, that is, the insulating patterns included in the spaced insulating layer have sufficient heights, for example, which are similar to or substantially the same as the height of the spacer layer, and thus the insulating patterns can be used as the mask supporting layer in the electrode opening region. For example, when the mask is used to form the organic light-emitting layer of the light-emitting element by means of evaporation or the like, the mask can be supported on the plurality of insulating patterns in the electrode opening region, the spacer layer in the display region, and the encapsulation glue in the encapsulation region, so as to improve the force uniformity of the mask in each region of the display substrate and further improve the force uniformity of the encapsulation glue and the flatness of the mask, thereby avoiding defects such as Newton rings, color shift, or the like, and improving the display effect of the display substrate.

Hereinafter, with reference to the accompanying drawings, the display substrate and the manufacturing method thereof, the display panel, and the wearable display device provided by the embodiments of the present disclosure will be described in detail through several specific examples.

Figure 2:
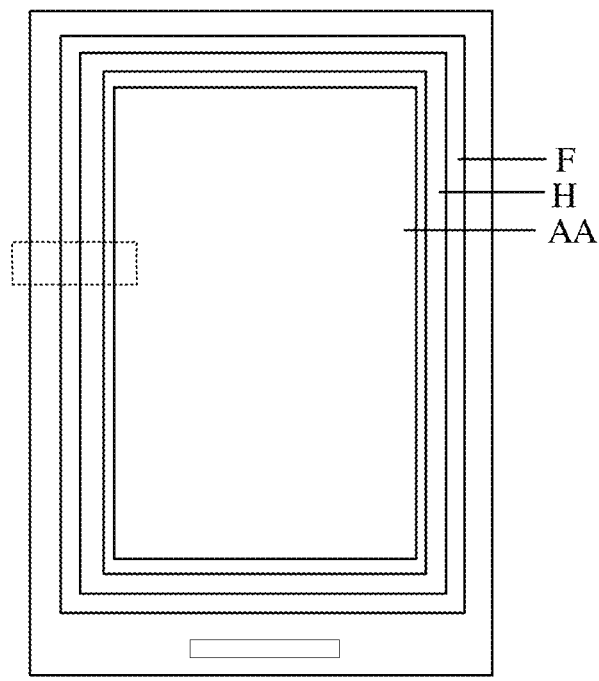
FIG. 2 is a schematic planar diagram of a display substrate provided by at least one embodiment of the present disclosure.
Figure 3:
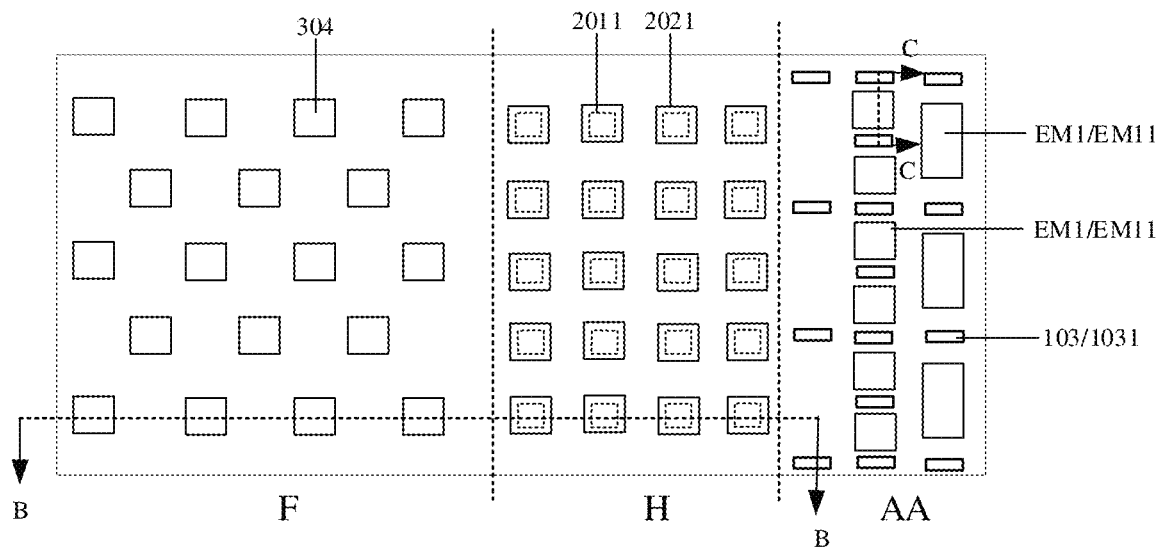
FIG. 3 is an enlarged view of the display substrate in a dotted frame illustrated in FIG. 2.
Figure 4A:
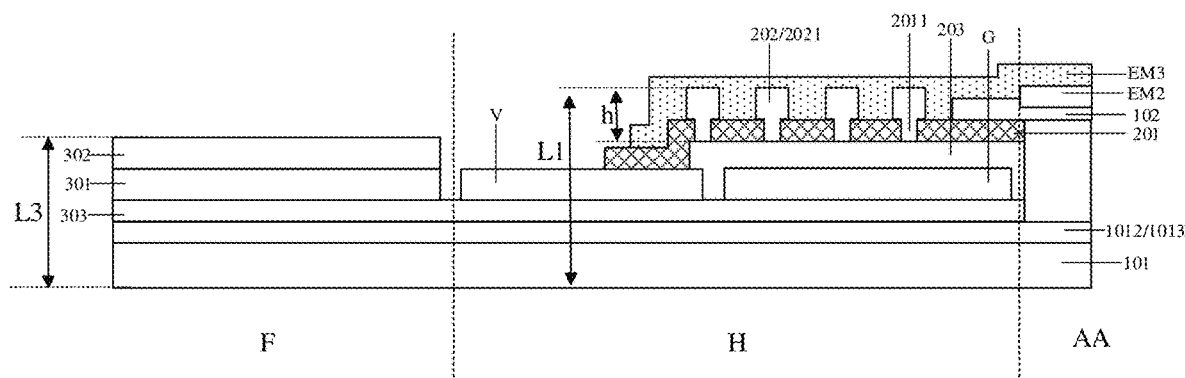
FIG. 4A is a schematic cross-sectional diagram of the display substrate in FIG. 3 along a line B-B.
Figure 4B:
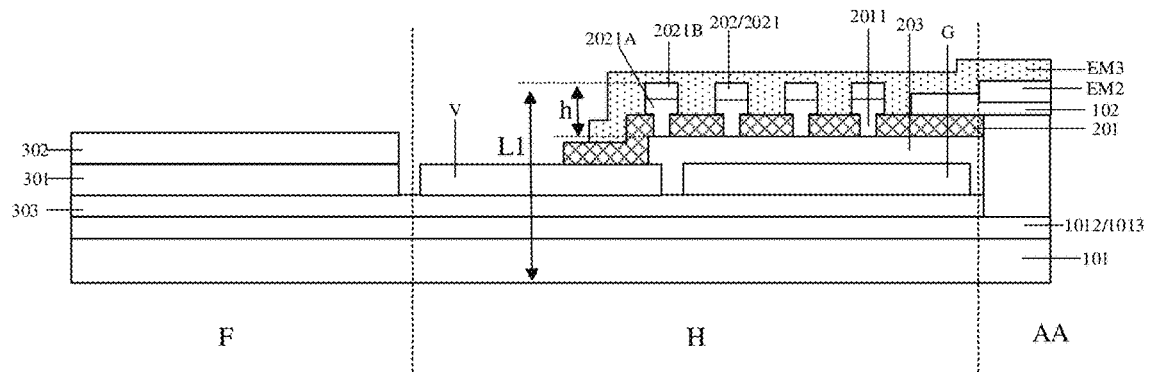
FIG. 4B is another schematic cross-sectional diagram of the display substrate in FIG. 3 along the line B-B.
Figure 5:
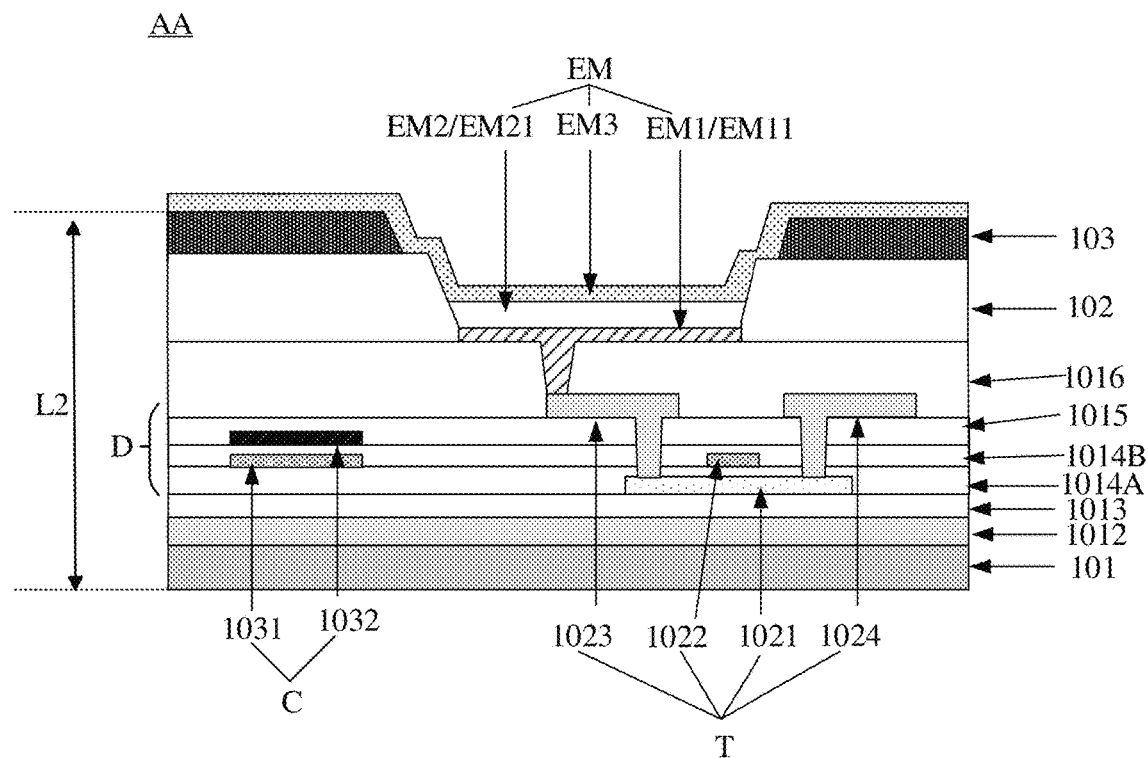
FIG. 5 is a schematic cross-sectional diagram of the display substrate in FIG. 3 along a line C-C.

For example, FIG. 2 shows a schematic planar diagram of a display substrate provided by at least one embodiment of the present disclosure, FIG. 3 shows an enlarged view of the display substrate in a dotted frame illustrated in FIG. 2, FIG. 4A and FIG. 4B show schematic cross-sectional diagrams of the display substrate in FIG. 2 along a line B-B, and FIG. 5 shows a schematic cross-sectional diagram of the display substrate in FIG. 2 along a line C-C.

As illustrated in FIG. 2 to FIG. 5, the display substrate includes a base substrate 101 and has a display region AA, an encapsulation region F surrounding the display region AA, and an electrode opening region H between the display region AA and the encapsulation region F. As illustrated in FIG. 2, the electrode opening region H at least partially surrounds the display region AA, and the encapsulation region F at least partially surrounds the electrode opening region H.

For example, as illustrated in FIG. 5, the display region AA includes a pixel array, thereby including a pixel driving circuit layer D disposed on the base substrate 101, a light-emitting element stack layer EM disposed on a side of the pixel driving circuit layer D away from the base substrate, a pixel definition layer 102 disposed on a side of the pixel driving circuit layer D away from the base substrate 101, and a spacer layer 103 disposed on a side of the pixel definition layer 102 away from the base substrate 101.

The light-emitting element stack layer EM includes a first electrode layer EM1, a light-emitting layer EM2, and a second electrode layer EM3, and the light-emitting layer EM2 is located between the first electrode layer EM1 and the second electrode layer EM3. One of the first electrode layer EM1 and the second electrode layer EM3 is an anode layer, and the other is a cathode layer. For example, the first electrode layer EM1 is an anode layer, and the second electrode layer EM3 is a cathode layer. For example, the first electrode layer EM1 is on a side of the light-emitting layer EM2 close to the base substrate 101 and includes a plurality of first electrodes EM11, the pixel definition layer 103 includes a plurality of sub-pixel openings, and the plurality of sub-pixel openings respectively expose the plurality of first electrodes EM11, that is, each of the plurality of sub-pixel openings exposes one first electrode. The light-emitting layer EM2 includes a plurality of sub-light-emitting layers EM21 located in the plurality of sub-pixel openings, and the plurality of first electrodes EM11, the plurality of sub-light-emitting layers EM21, and the second electrode layer EM3 are correspondingly combined to form a plurality of light-emitting elements. For example, the plurality of first electrodes EM11 are respectively electrically connected to the plurality of pixel driving circuits in the pixel driving circuit layer D, so as to control the working state of the plurality of light-emitting elements through the plurality of pixel driving circuits, thereby realizing the display effect of the display substrate. For example, the light-emitting layer EM2 is disposed on a side of a portion of the pixel definition layer 102 located in the electrode opening region H away from the base substrate 101, and for example, the light-emitting layer EM2 is an organic light-emitting layer.

For example, as illustrated in FIG. 4A and FIG. 4B, the electrode opening region H includes a third electrode layer 201 disposed on the base substrate 101 and a spaced insulating layer 202 on a side of the third electrode layer 201 away from the base substrate 101. The third electrode layer 201 includes a plurality of electrode openings 2011 spaced apart from each other, the spaced insulating layer 202 includes a plurality of insulating patterns 2021 spaced apart from each other, each of the plurality of insulating pattern 2021 fills a corresponding electrode opening 2011, and the orthographic projection of the each of the plurality of insulating pattern 2021 on the base substrate 101 covers the orthographic projection of the corresponding electrode opening 2011 on the base substrate 101. For example, the plurality of insulating patterns 2021 respectively fill the plurality of electrode openings 2011 and cover edges of the plurality of electrode openings 2011, respectively. The plurality of insulating patterns 2021 can protect the third electrode layer 201, so as to prevent the third electrode layer 201 from being unnecessarily corroded during the manufacturing process of the display substrate.

For example, as illustrated in FIG. 4A and FIG. 4B, the maximum distance between the side of the spaced insulating layer 202 away from the base substrate 101 and the base substrate 101 is the first distance L1; as illustrated in FIG. 5, the maximum distance between the side of the spacer layer 103 away from the base substrate 101 and the base substrate 101 is the second distance L2; and for example, the ratio of the first distance L1 to the second distance L2 ranges from 0.9 to 1.1, such as 1. Thus, the first distance L1 and the second distance L2 are similar or substantially equal. In the manufacturing process of the display substrate, when the organic light-emitting layer of the light-emitting element is formed by evaporation using a mask, the mask can be uniformly supported on the plurality of insulating patterns in the electrode opening region, the spacer layer in the display region, and the encapsulation glue in the encapsulation region, so as to improve the flatness of the mask and improve the uniformity of the force of the mask in each region of the display substrate, thereby avoiding the occurrence of defects such as Newton rings, color shift, or the like, and improving the display effect of the display substrate.

For example, in some embodiments, as illustrated in FIG. 4B, the spaced insulating layer 202 includes a first layer 2021A and a second layer 2021B arranged in sequence along the direction away from the base substrate 101. With respect to the base substrate 101, at least one layer of the spaced insulating layer 2021 is disposed in the same layer as the spacer layer 103.

For example, in some embodiments, with respect to the base substrate 201, the third electrode layer 201 and the first electrode layer EM1 are disposed in the same layer.

It should be noted that, in the embodiments of the present disclosure, "in the same layer" means that two or more functional layers or structural layers are located in the same layer in the hierarchical structure of the display substrate and are formed with the same material, that is, in the manufacturing process, the two or more functional layers or structural layers can be formed of the same material layer, and the desired patterns and structures can be formed through the same patterning process.

For example, in some embodiments, the third electrode layer 201 is disconnected from the first electrode layer EM1, that is, the third electrode layer 201 is not electrically connected with the first electrode layer EM1.

For example, in some embodiments, as illustrated in FIG. 4A, the first layer 2021A and the second layer 2021B of the spaced insulating layer 202 are both disposed in the same layer as the spacer layer 103, and in this case, the first layer 2021A and the second layer 2021B of the spaced insulating layer 202 may be an integral structure, which is integrally formed during the manufacturing process. In other embodiments, as illustrated in FIG. 4B, the first layer 2021A of the spaced insulating layer 202 is arranged in the same layer as the spacer layer 103, and the second layer 2021B of the spaced insulating layer 202 is arranged in the same layer as the pixel definition layer 102. Therefore, the spaced insulating layer 202 can have a sufficient height to serve as a mask support layer in the electrode opening region H, and when a mask is used to form the light-emitting layer EM2 by evaporation or the like, the mask can be supported on the spacer layer 103 in the display region AA, the plurality of insulating patterns 202 in the electrode opening region H, and the encapsulation glue 302 (described later) in the encapsulation region F, so as to improve the force uniformity of the mask on the display substrate and simultaneously improve the force uniformity of the encapsulation glue and the flatness of the mask, thereby avoiding the occurrence of undesirable phenomena such as Newton rings, color shift, or the like.

For example, as illustrated in FIG. 3, the spacer layer 103 includes a plurality of spacers 1031 arranged in an array in the display region AA. In this case, when the mask is used to form the light-emitting layer EM2 by evaporation or the like, the mask can be evenly supported on the plurality of spacers 1031 in the display region AA, thereby improving the flatness of the mask in the display region AA, improving the uniformity of the formed light-emitting layer EM2, and further improving the display effect.

For example, the height h of the spacers 1031 in the spacer layer 103 in the direction perpendicular to the base substrate 101 ranges from 1.5 µm to 2.5 µm, such as 1.6 µm, 1.9 µm, 2.2 µm, or the like. In this case, where the spaced insulating layer 202 and the spacer layer 103 are disposed in the same layer, the plurality of insulating patterns 2021 in the spaced insulating layer 202 and the plurality of spacers 1031 in the spacer layer 103 have the same height h in the direction perpendicular to the base substrate 101, and the height h ranges from 1.5 µm to 2.5 µm, for example, 1.6 µm, 1.9 µm, 2.2 µm, or the like. For example, the height of the pixel definition layer 102 in the direction perpendicular to the base substrate 101 ranges from 1 µm to 1.2 µm, such as 1.1 µm or the like. In this case, where the spaced insulating layer 202 is disposed in the same layer as the spacer layer 103 and the pixel definition layer 102, the height of the plurality of insulating patterns 2021 in the spaced insulating layer 202 is equal to a sum of the height of the spacer layer 103 and the height of the pixel definition layer 102. Thus, the plurality of insulating patterns 2021 in the spaced insulating layer 202 have a sufficient height to support the mask.

For example, the angle formed between the sidewall of each of the plurality of insulating patterns 2021 and the plane parallel to the base substrate 201 may range from 10° to 60°, such as 15°, 19°, 25°, 30°, 45°, or the like, and in this case, the adhesion between the plurality of insulating patterns 2021 and the third electrode layer 201 can be stronger, so as to enhance the structural stability.

For example, the planar shape of each of the insulating patterns 2021 is a polygon, such as a rectangle, a square, or the like. For example, in the case where the shape of each of the insulating patterns 2021 is a square, the side length of the square may be 18 µm~20 µm, for example, 19 µm. In the case where the shape of each of the insulating patterns 2021 is a rectangle, the length of the rectangle may be 18 µm~22 µm, and the width of the rectangle may be 16 µm~20 µm. For example, the planar shape of each of the spacers 1031 in the spacer layer 103 is a polygon, such as a rectangle or a square. For example, in the case where the planar shape of each of the spacers 1031 in the spacer layer 103 is a rectangle, the length of the rectangle may be 20 µm~22 µm, such as 21 µm, and the width of the rectangle may be 8 µm10 µm, such as 9 µm.

Figure 8:
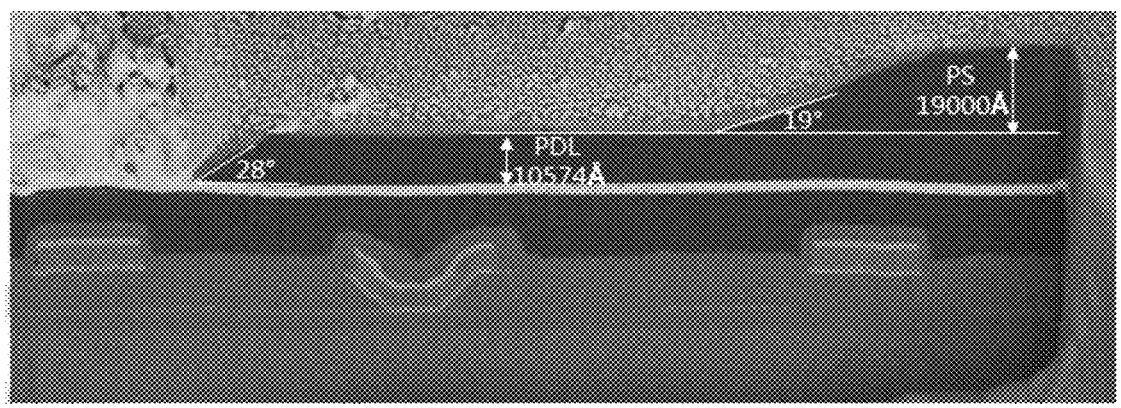
FIG. 8 is a microscopic cross-sectional diagram of a spacer layer and a pixel definition layer of a display substrate provided by at least one embodiment of the present disclosure.

For example, FIG. 8 shows a microscopic cross-sectional diagram of the spacer (PS) in the spacer layer 103 and the pixel definition layer (PDL), and for example, the plurality of insulating patterns 2021 in the electrode opening region H have a similar structure to the spacer (PS) in FIG. 8. As illustrated in FIG. 8, in some examples, the height of the spacer (PS) is 19000 Å, that is, 1.9 µm, the angle formed by the sidewall of the spacer (PS) and the plane parallel to the base substrate 201 is 19°, the height of the pixel definition layer (PDL) is 10574 Å, that is, 1.0574 µm, and the angle formed by the sidewall of the pixel definition layer (PDL) and the plane parallel to the base substrate 201 is 28°.

For example, in some embodiments, the material of the spaced insulating layer 201 and the spacer layer 103 may include a photosensitive resin material, such as polyimide or other photoresist materials. Therefore, the spaced insulating layer 201 and the spacer layer 103 can be directly formed by simply exposing, developing, or the like during the manufacturing process.

For example, in some embodiments, as illustrated in FIG. 4A, the electrode opening region H further includes a gate driving circuit G disposed on the base substrate 101 and a second planarization layer 203 disposed on a side of the gate driving circuit G away from the base substrate 101, the third electrode layer 201 is disposed on a side of the second planarization layer 203 away from the base substrate 101, and the plurality of electrode openings 2011 expose the second planarization layer 203. Because the second planarization layer 203 will generate gas during the manufacturing process, if the gas cannot be exhausted, air bubbles may be generated in the second planarization layer 203, which will affect the flatness of the third electrode layer 201 and adversely affect the electrical connection of the third electrode layer 201 with other circuits. Therefore, the plurality of electrode openings 2011 in the third electrode layer 201 exposing the second planarization layer 203 can discharge the gas that may be generated in the second planarization layer 203, thereby avoiding the occurrence of the above-mentioned undesirable phenomena.

For example, the display region AA of the display substrate includes a pixel array, the pixel array includes a plurality of sub-pixels arranged in an array, each of the plurality of sub-pixels includes the above-mentioned light-emitting element and a pixel driving circuit in the pixel driving circuit layer D, and the pixel driving circuit includes a row scanning signal terminal, a light-emitting control signal terminal, and a data signal terminal, which are used for respectively receiving a row scanning signal, a light-emitting control signal, and a data signal, and are configured to work according to the scanning signal, the light-emitting control signal, and the data signal. For example, the gate driving circuit G may include driving circuits such as a row scanning driving circuit and a light-emitting scanning driving circuit, the row scanning driving circuit is configured to provide the above-mentioned row scanning signal, and the light-emitting scanning driving circuit is configured to provide the above-mentioned light-emitting control signal.

For example, in some embodiments, the gate driving circuit G and the pixel driving circuit layer D are disposed at least partially in the same layer.

For example, each pixel driving circuit in the pixel driving circuit layer D may be implemented as a 2T1C structure (that is, two thin film transistors and one storage capacitor), a 7T1C structure (that is, seven thin film transistors and one storage capacitor), etc., and may be implemented in a multi-layer structure including an insulating layer, a semiconductive layer, a conductive layer (a metal layer or a metal oxide layer), or the like. The embodiments of the present disclosure do not limit the specific structure, type, composition, or the like of the pixel driving circuit. FIG. 5 shows one of the thin film transistors T and the storage capacitor C as an example. The thin film transistor T is a transistor in the pixel driving circuit which is directly electrically connected to the light-emitting element. For the sake of simplicity, the remaining transistors in the pixel driving circuit are not shown, and for example, the storage capacitor C is used to store a data voltage signal for the pixel driving circuit to realize gray level display.

For example, the thin film transistor T includes structures such as an active layer 1021, a gate electrode 1022, and source and drain electrodes (including a source electrode 1023 and a drain electrode 1024) which are sequentially arranged on the base substrate 101. A first gate insulating layer 1014A is disposed between the active layer 1021 and the gate electrode 1022, and a second gate insulating layer 1014B and a first interlayer insulating layer 1015 are disposed between the gate electrode 1022 and the source and drain electrodes. The storage capacitor C of the pixel driving circuit includes a first capacitor plate 1031 and a second capacitor plate 1032, and the second gate insulating layer 1014B is provided between the first capacitor plate 1031 and the second capacitor plate 1032 to serve as the medium of the storage capacitor C. For example, the first capacitor plate 1031 and the gate electrode 1022 are disposed in the same layer. For example, the pixel driving circuit is covered with the first planarization layer 1016, and the first electrode EM11 of the light-emitting element is connected to the source electrode 1023 of the thin film transistor through a via in the first planarization layer 1016, so that the working state of the light-emitting element can be controlled through the pixel driving circuit. For example, the first planarization layer 1016 in the display region AA and the second planarization layer 203 in the electrode opening region H are disposed in the same layer.

For example, in the gate driving circuit G, the row scanning driving circuit includes a plurality of cascaded first shift register units, each of the plurality of first shift register units includes a first scanning signal output terminal, and the first scanning signal output terminals respectively correspond to a plurality of rows of sub-pixels in the display region AA and are connected to the row scanning signal terminals of the sub-pixels through corresponding wires. Similarly, the light-emitting scanning driving circuit includes a plurality of cascaded second shift register units, each of the plurality of second shift register units includes a second scanning signal output terminal, and the second scanning signal output terminals respectively correspond to a plurality of rows of sub-pixels in the display region AA and are connected to the light-emitting control signal terminals of the sub-pixels through corresponding wires.

For example, the first shift register units included in the row scanning driving circuit in the gate driving circuit G or the second shift register units included in the light-emitting scanning driving circuit may have a 4T1C structure, that is, include at least four transistors and one capacitor to realize functions such as signal input, signal output, register reset, etc., and may also include more transistors and/or capacitors, such as adding sub-circuits to realize functions such as pull-up node control, pull-down node control, noise reduction, etc., so as to achieve more stable input, output, and reset. The gate driving circuit may also be realized by a multi-layer structure including an insulating layer, a semiconductive layer, a conductive layer (a metal layer or a metal oxide layer), etc., and for example, may share part of the manufacturing process with the pixel driving circuit. The embodiments of the present disclosure do not limit the specific structure, type, composition, or the like of the gate driving circuit.

Figure 6:
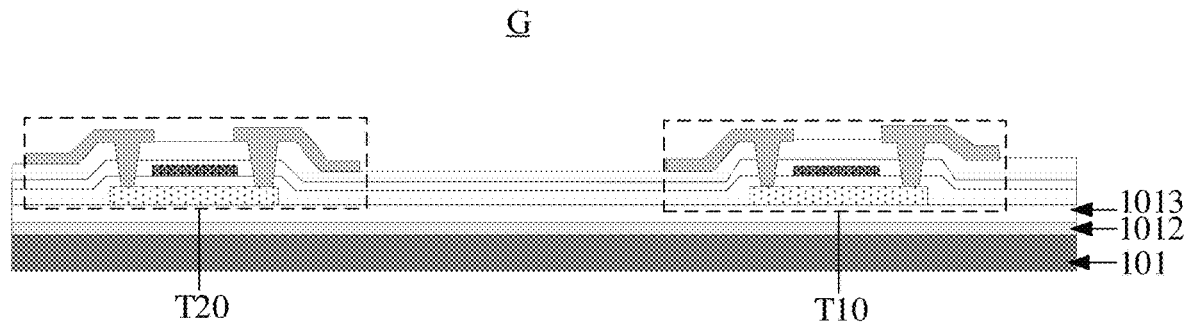
FIG. 6 is a partial schematic cross-sectional diagram of a gate driving circuit of the display substrate in FIG. 3.
Figure 7:
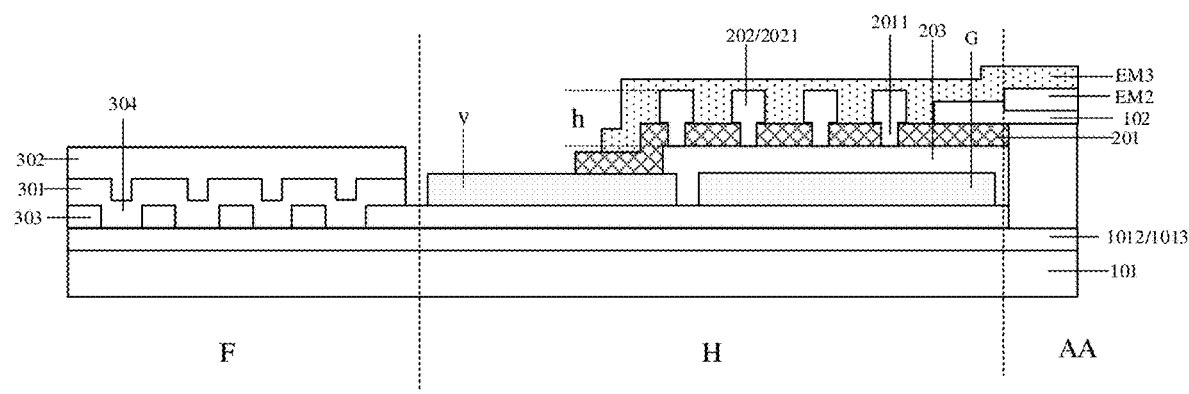
FIG. 7 is still another schematic cross-sectional diagram of the display substrate in FIG. 3 along the line B-B.

For example, FIG. 6 shows a partial schematic cross-sectional diagram of the gate driving circuit G. As illustrated in FIG. 6, the row scanning driving circuit includes a thin film transistor T10 and other structures, and the light-emitting scanning driving circuit includes a thin film transistor T20 and other structures. The thin film transistors T10 and T20 also respectively include structures such as an active layer, a gate electrode, a source electrode, a drain electrode, or the like. For example, the thin film transistors T10 and T20 are disposed in the same layer as the thin film transistor T of the pixel driving circuit, that is, layers of the thin film transistors T10 and T20 are disposed in the same layer as the corresponding layers in the thin film transistor T of the pixel driving circuit, respectively. Therefore, the corresponding structural layers disposed in the same layer can be formed by using the same material layer and using the same process, thereby simplifying the manufacturing process of the display substrate.

For example, in some embodiments, as illustrated in FIG. 4A, the second electrode layer EM3 is continuously disposed in the display region AA and extends from the display region AA to the electrode opening region H. The second electrode layer EM3 is connected to the third electrode layer 201 through a gap between the plurality of insulating patterns 2021 in the electrode opening region H and is in contact and overlapped with the third electrode layer 201 at one side (the left side illustrated in the figure) of the third electrode layer 201.

For example, the electrode opening region H further includes a power line V disposed on the base substrate 201, and for example, the power line V is a VSS power line which is used to provide a low-level voltage signal in the display substrate. For example, the display substrate also has a VDD power line for providing a high-level voltage signal, which is not shown in the figure. The third electrode layer 201 extends to a side of the power line V away from the base substrate 101 to be connected to the power line V. Thus, both the second electrode layer EM3 and the third electrode layer 201 are electrically connected to the power line V.

For example, the power line V is provided in the same layer as part of the circuits of the gate driving circuit G, and is provided on a side of the gate driving circuit G away from the display region A. For example, in some examples, the power line V may be disposed around the display region AA in the electrode opening region H.

For example, in some embodiments, the power line V may be disposed in the same layer as the source and drain electrodes of the thin film transistor in the gate driving circuit G, so that the same material layer and the same preparation process may be used in the manufacturing process.

For example, in some embodiments, as illustrated in FIG. 5 and FIG. 6, the display substrate may further include a barrier layer 1012 and a buffer layer 1013 disposed on the base substrate 101, the barrier layer 1012 can prevent impurities such as water and oxygen from penetrating into functional structures such as the thin film transistor T from the base substrate 110, and the buffer layer 1013 can provide a flat surface to facilitate the arrangement of other functional layers of the display substrate. The barrier layer 1112 and the buffer layer 1013 can jointly protect other functional structures on the base substrate 110.

For example, in some embodiments, as illustrated in FIG. 4A, the encapsulation region F includes an encapsulation base 301 disposed on the base substrate 101 and an encapsulation glue 302 disposed on a side of the encapsulation base 301 away from the base substrate 101. The encapsulation base 301 facilitates bonding the encapsulation glue 302 on the base substrate 101, so as to enhance the adhesion between the encapsulation glue 302 and the base substrate 101. For example, in some embodiments, an interlayer insulating layer may also be disposed between the encapsulation base 301 and the encapsulation glue 302, which is not shown in the figure and will be described in detail later.

For example, as illustrated in FIG. 4A, the distance from the surface of the encapsulation glue 302 away from the base substrate 101 to the base substrate 101 is a third distance L3, and a ratio of the third distance L3 to the second distance L2, from the surface of the insulating pattern 2021 in the spaced insulating layer 202 away from the base substrate 101 to the base substrate 101, ranges from 1.2 to 0.8, for example, 1.1, 1, 0.9, or the like. Therefore, the first distance L1, the second distance L2, and the third distance L3 are similar or substantially equal. In the manufacturing process of the display substrate, in the case where the organic light-emitting layer of the light-emitting element is formed by evaporation using a mask, the mask can be uniformly supported on the plurality of insulating patterns in the electrode opening region, the spacer layer in the display region, and the encapsulation glue in the encapsulation region, so that the flatness of the mask is improved, and the force uniformity of the mask in each region of the display substrate is improved, thereby avoiding the occurrence of undesirable phenomena such as Newton rings, color shift, or the like, and improving the display effect of the display substrate.

For example, the material of the encapsulation base 301 may include metal, for example a metal material, such as molybdenum, aluminum, titanium, or the like, or a metal alloy material thereof.

For example, in some embodiments, the encapsulation base 301 may be disposed in the same layer as part of the circuits of the gate driving circuit G (or the pixel driving circuit). For example, the encapsulation base 301 and the gate electrode of the thin film transistor in the gate driving circuit G (or the gate electrode 1022 of the thin film transistor T in the pixel driving circuit) are arranged in the same layer, so that the same material layer can be used in the preparation process and formed by the same preparation process.

For example, FIG. 6 shows another schematic cross-sectional diagram of the display substrate in FIG. 3 along the line BB. As illustrated in FIG. 3 and FIG. 6, in some embodiments, the encapsulation region F and the electrode opening region H also have an insulating layer 303 on the buffer layer 1013, the insulating layer 303 has a plurality of openings 304 in the encapsulation region F, and the encapsulation base 301 is filled in the plurality of openings 304, thereby increasing the contact area of the encapsulation base 301 with the base substrate 101 and the buffer layer 1013, and further increasing the contact area of the encapsulation base 301 with the encapsulation glue 302, so as to achieve the technical effect of increasing the adhesiveness. For example, in some examples, the insulating layer 303 may be disposed in the same layer as one or more of the first gate insulating layer 1014A, the second gate insulating layer 1014B, and the first interlayer insulating layer 1015 in the pixel driving circuit layer D, or may also be an additional independent insulating layer.

For example, in some embodiments, the display substrate may further include other functional layers such as an encapsulation layer (not shown) for encapsulating the plurality of light-emitting elements, and other structures of the display substrate are not specifically limited in the embodiments of the present disclosure. For example, the above-mentioned encapsulation layer includes a stack of multiple organic encapsulation sub-layers and/or inorganic encapsulation sub-layers to achieve better encapsulation effect.

For example, in some embodiments, the base substrate 101 may be a rigid substrate such as a glass substrate or a quartz substrate, or may also be a flexible substrate such as a polyimide (PI) substrate. For example, the materials of the gate electrode 1022, the first electrode plate 1031, and the second electrode plate 1032 may include metal or alloy materials such as aluminum, titanium, cobalt, copper, etc., and may be formed into a single-layer or multi-layer structure. The materials of the source and drain electrodes 1023 and 1024 may include metal or alloy materials such as aluminum, titanium, cobalt, copper, etc., and may be formed into a single-layer or multi-layer structure. The active layer 1021 may be made of materials such as polysilicon and metal oxide. The barrier layer 1112, the buffer layer 1013, the first gate insulating layer 1014A, the second gate insulating layer 1014B, the first interlayer insulating layer 1015, and the insulating layer 303 may be made of inorganic insulating materials such as silicon oxide, silicon nitride, or silicon oxynitride. For example, the first planarization layer 1016, the second planarization layer 203, and the pixel definition layer 102 may be made of organic insulating materials such as polyimide and resin. The embodiments of the present disclosure do not limit the material of each functional layer, and the material of each functional layer is not limited to the above examples.

For example, FIG. 9A to FIG. 9H are schematic diagrams of functional layers being sequentially stacked of a display substrate provided by at least one embodiment of the present disclosure, and FIG. 10A to FIG. 10H are schematic diagrams of respective functional layers of a display substrate provided by at least one embodiment of the present disclosure.

Figure 9A:
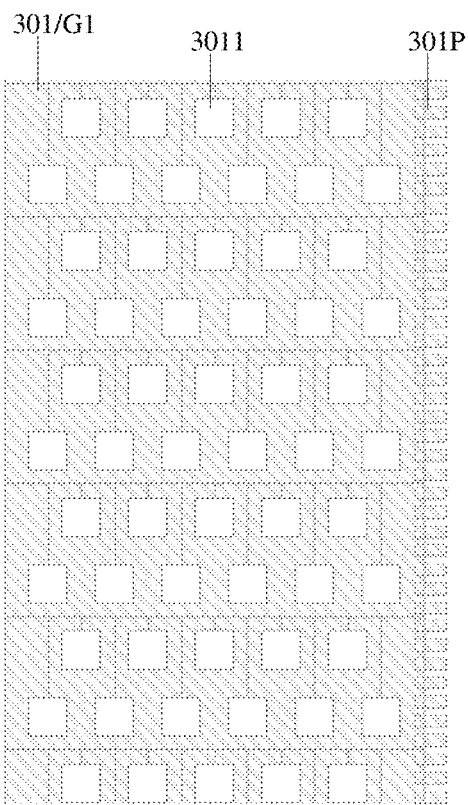
FIG. 9A to FIG. 9H are schematic diagrams of functional layers being sequentially stacked of a display substrate provided by at least one embodiment of the present disclosure.
Figure 9A:
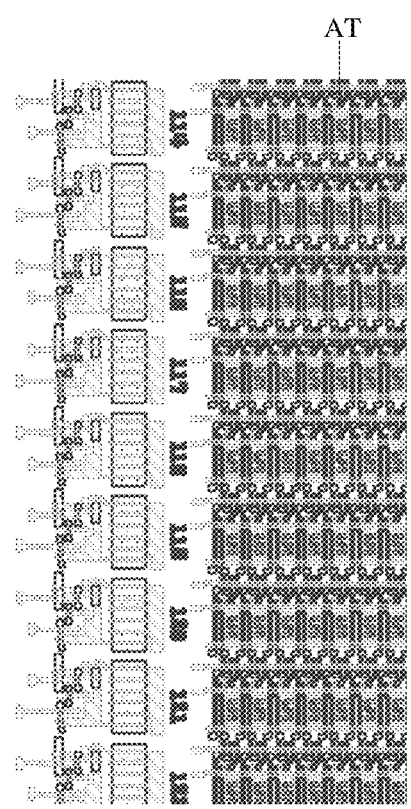
Figure 10A:
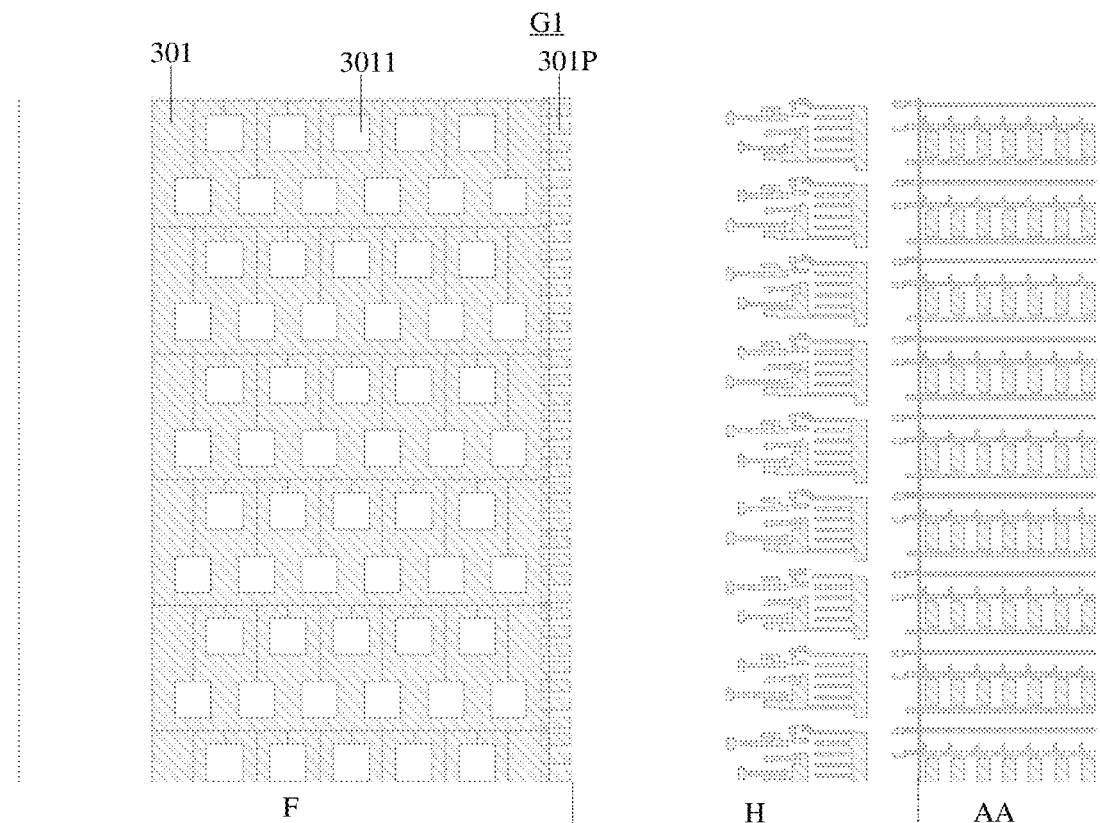
FIG. 10A to FIG. 10H are schematic diagrams of respective functional layers of a display substrate provided by at least one embodiment of the present disclosure.

For example, FIG. 9A shows a schematic diagram of the active layer AT overlapping with the first gate metal layer, and FIG. 10A shows a schematic diagram of the first gate metal layer. As illustrated in FIG. 9A and FIG. 10A, the active layer AT includes the active layer of the thin film transistor, and the first gate metal layer G1 includes the encapsulation base 301, the gate electrode of the thin film transistor, the first electrode plate of the storage capacitor, and other structures. For example, the encapsulation base 301 includes a plurality of first openings 3011 spaced apart from each other.

For example, functional layers such as a base substrate and a buffer layer are further provided below the active layer AT. The structure and arrangement of these functional layers may refer to related technologies, which are not limited in the embodiments of the present disclosure.

Figure 9B:
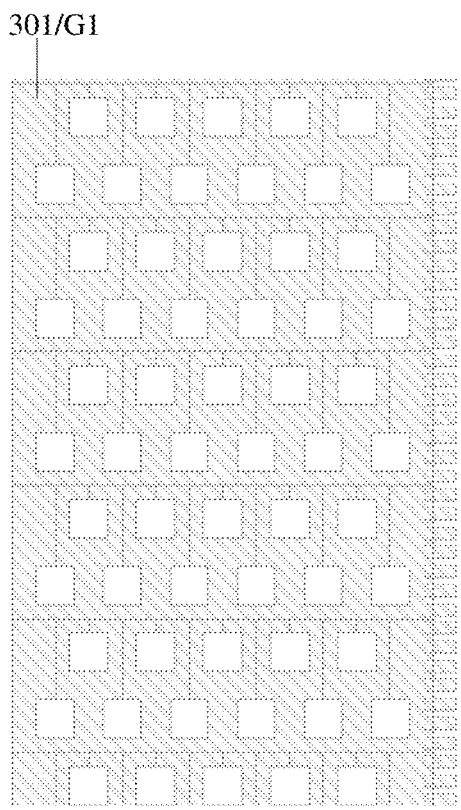
Figure 9B:
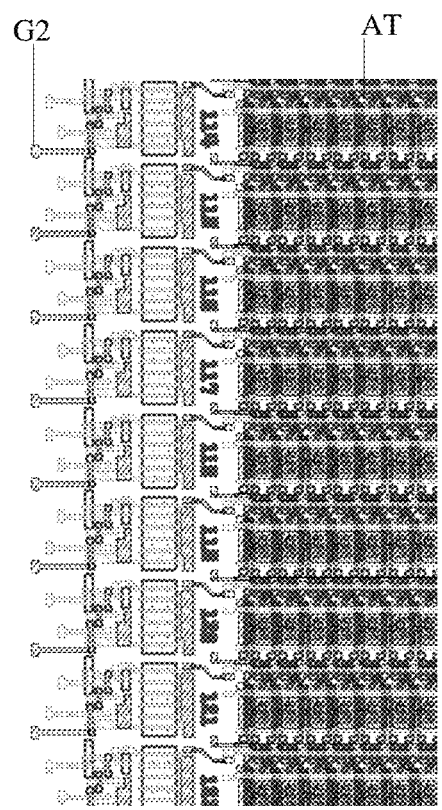
Figure 10B:
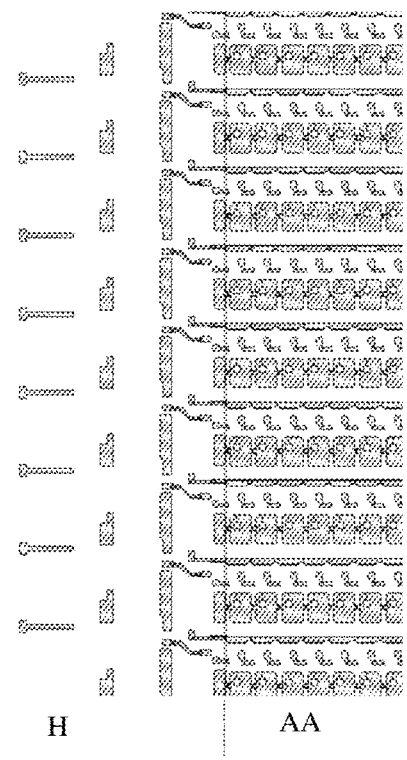

For example, FIG. 9B shows a schematic diagram of stacking a second gate metal layer on the basis of FIG. 9A, and FIG. 10B shows a schematic diagram of the second gate metal layer. As illustrated in FIG. 9B and FIG. 10B, the second gate metal layer G2 includes structures such as the second electrode plate of the storage capacitor.

Figure 9C:
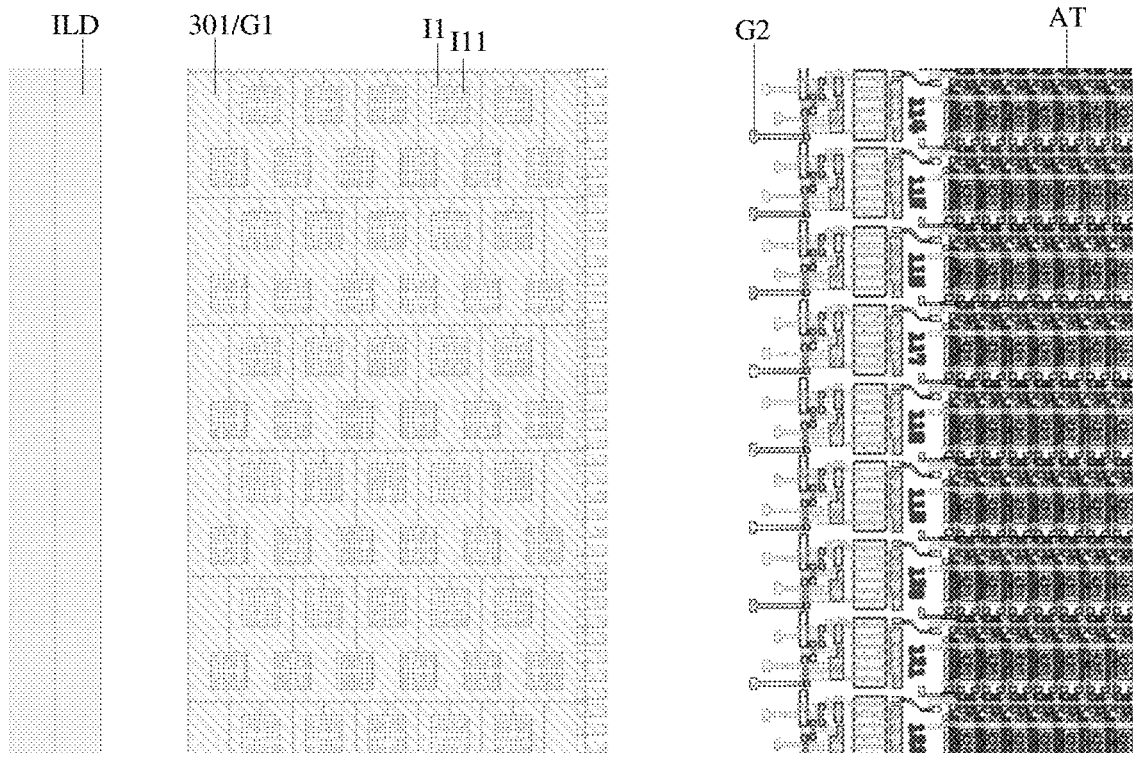
Figure 10C:
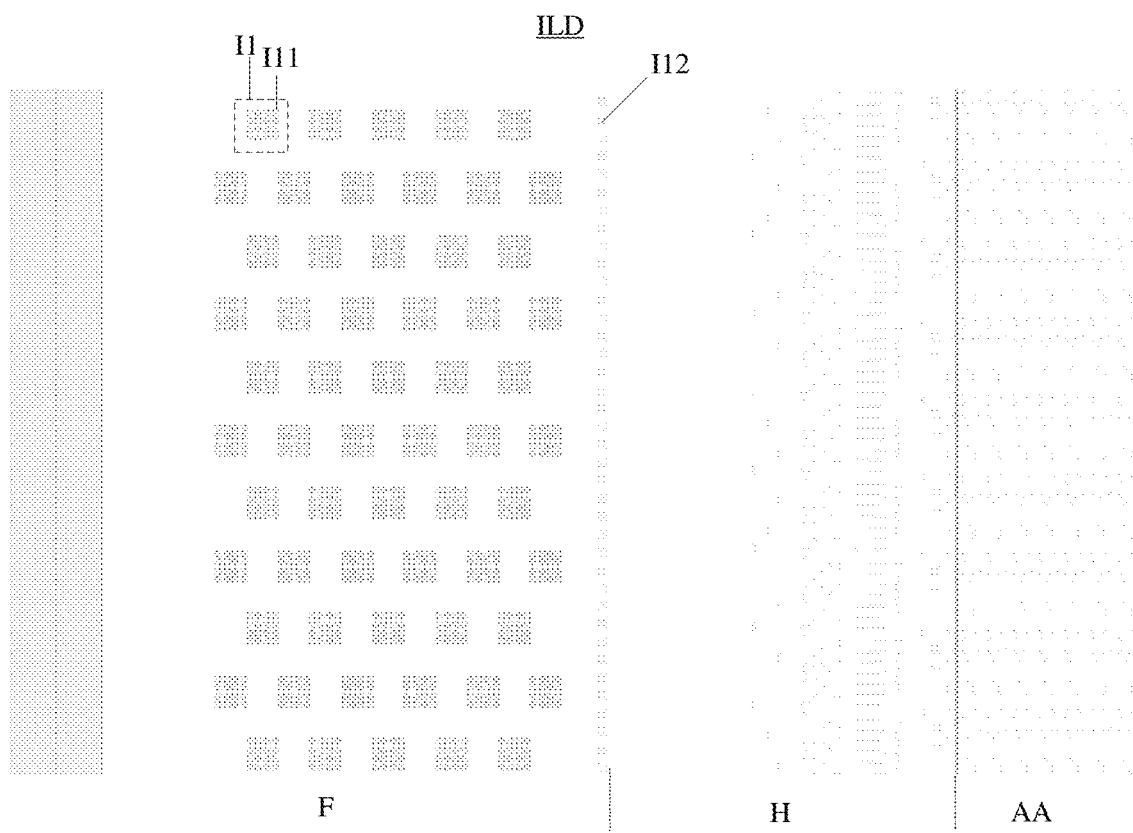

For example, FIG. 9C shows a schematic diagram of stacking an interlayer insulating layer on the basis of FIG. 9B, and FIG. 10C shows a schematic diagram of the interlayer insulating layer. As illustrated in FIG. 9C and FIG. 10C, the interlayer insulating layer ILD includes a plurality of groups of second openings I1, and each group of the second openings I1 includes a plurality of second openings I11 spaced apart from each other.

For example, the orthographic projection of each group of second openings I1 on the base substrate is located within the range of the orthographic projection of the corresponding first opening 3011 on the base substrate, and the interlayer insulating layer ILD is provided with the encapsulation glue (not shown in the figure, referring to the above embodiments). For example, the encapsulation glue is disposed in the plurality of first openings 3011 and the plurality of second openings I11, thereby enhancing the bonding strength of the encapsulation glue with the interlayer insulating layer ILD and the encapsulation base 301.

Figure 9D:
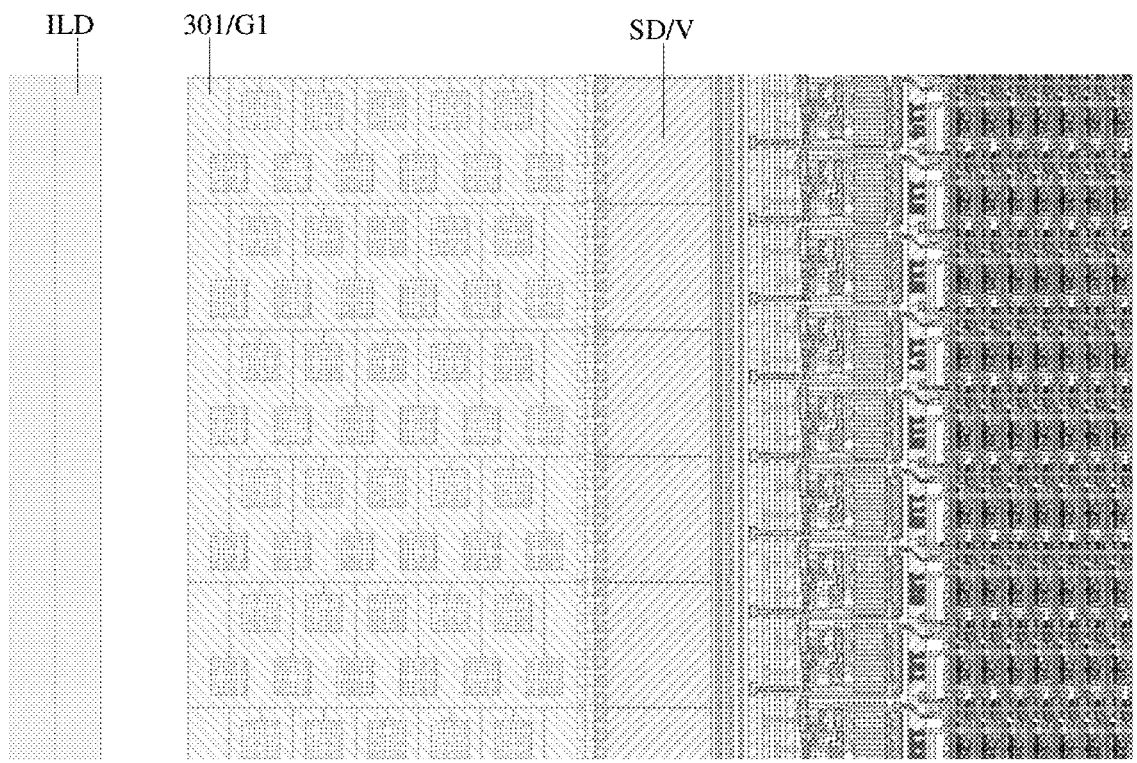
Figure 10D:
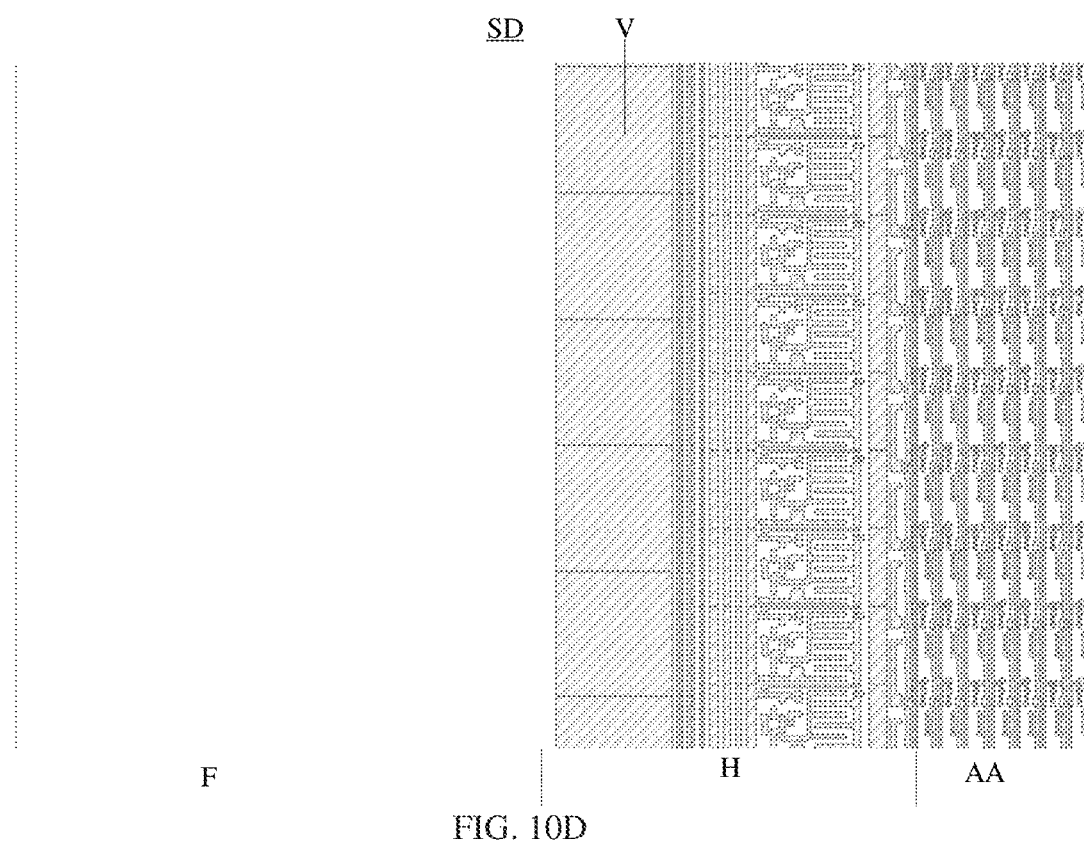

For example, FIG. 9D shows a schematic diagram of stacking a source-drain electrode layer on the basis of FIG. 9C, and FIG. 10D shows a schematic diagram of the source-drain electrode layer. As illustrated in FIG. 9D and FIG. 10D, the source-drain electrode layer SD includes the source and drain electrodes of the thin film transistor, the power line V, and other structures. For example, the power line V is a VSS power line for providing a low-level voltage signal to the display region AA.

For example, as illustrated in FIG. 9A and FIG. 10A, a plurality of protrusions 301P spaced apart from each other are provided on the edge of the encapsulation base 301 close to the electrode(anode) opening region H, and the plurality of protrusions 301P are connected to the power line V, such as the VSS power line, through the vias 112 (illustrated in FIG. 10C) in the interlayer insulating layer ILD.

Figure 9E:
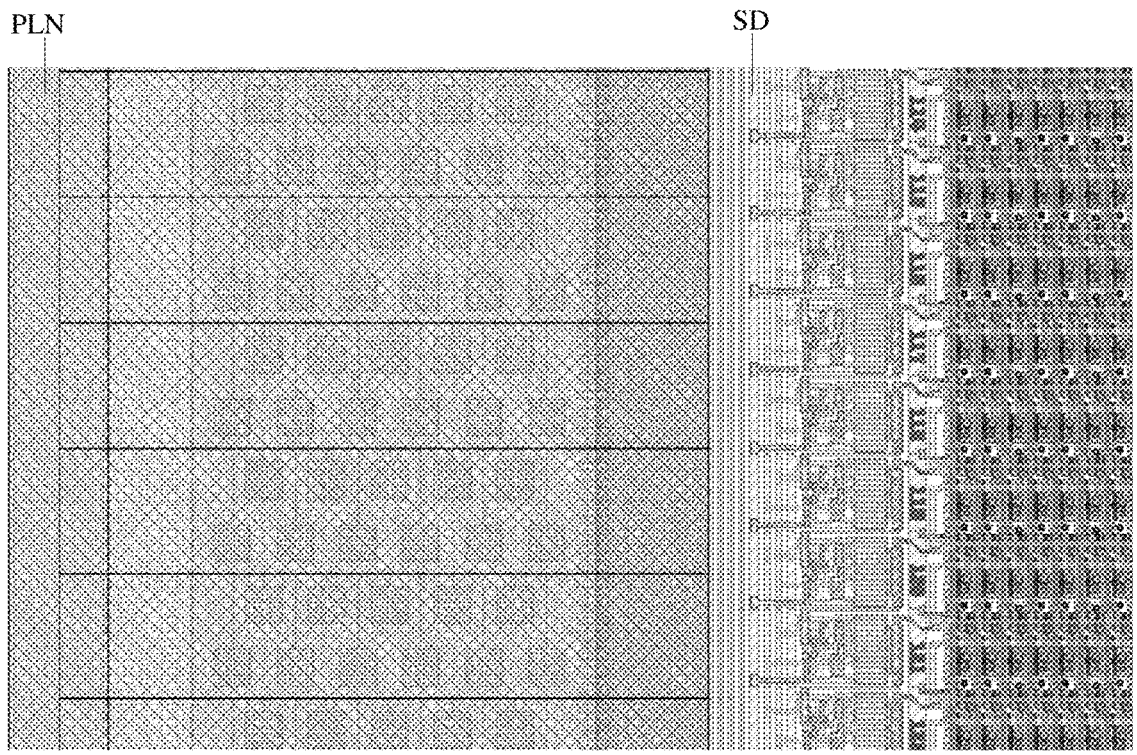
Figure 10E:
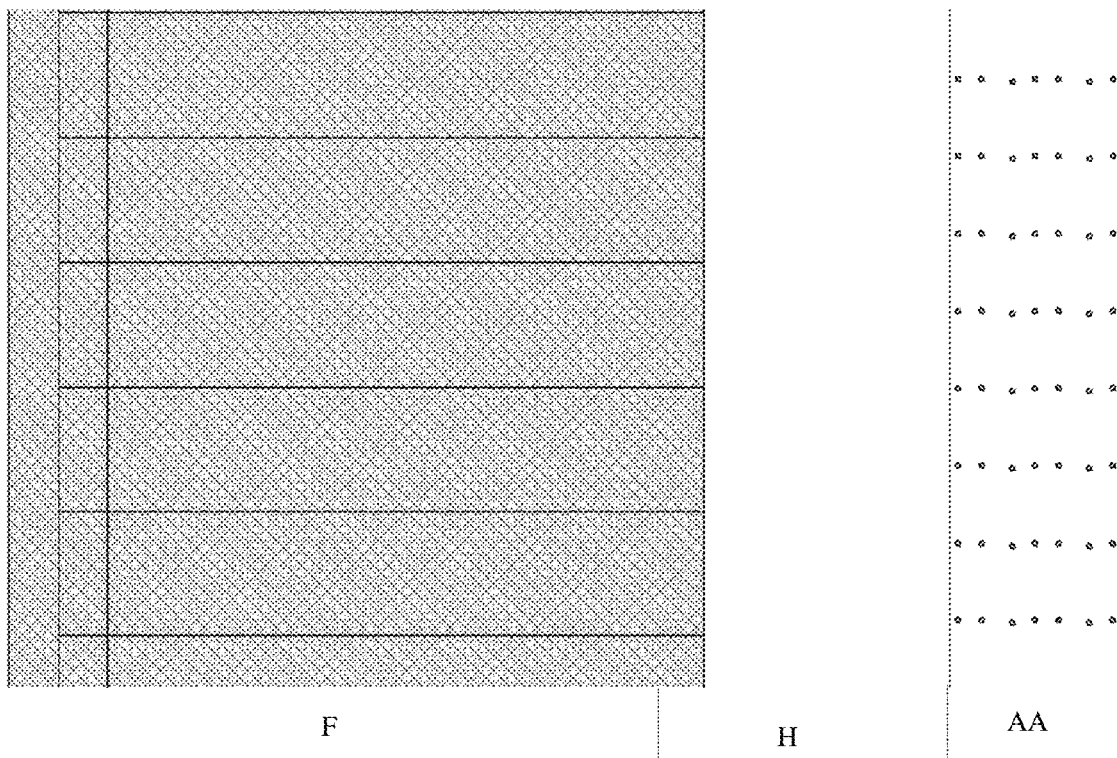

For example, FIG. 9E shows a schematic diagram of stacking a planarization layer PLN on the basis of FIG. 9D, and FIG. 10E shows a schematic diagram of the planarization layer PLN. The planarization layer PLN includes the first planarization layer 1016 in the display region AA and the second planarization layer 203 in the electrode opening region H.

For example, as illustrated in FIG. 9E and FIG. 10E, the shaded part in the figure is the part where the planarization layer PLN is not provided, that is, the planarization layer PLN extends from the display region AA to the electrode opening region H. For example, the planarization layer PLN has a plurality of vias (illustrated by circles in the figure) in the display region AA. For example, the vias are used to electrically connect the thin film transistors and the first electrodes of the light-emitting elements in the display region AA.

Figure 9F:
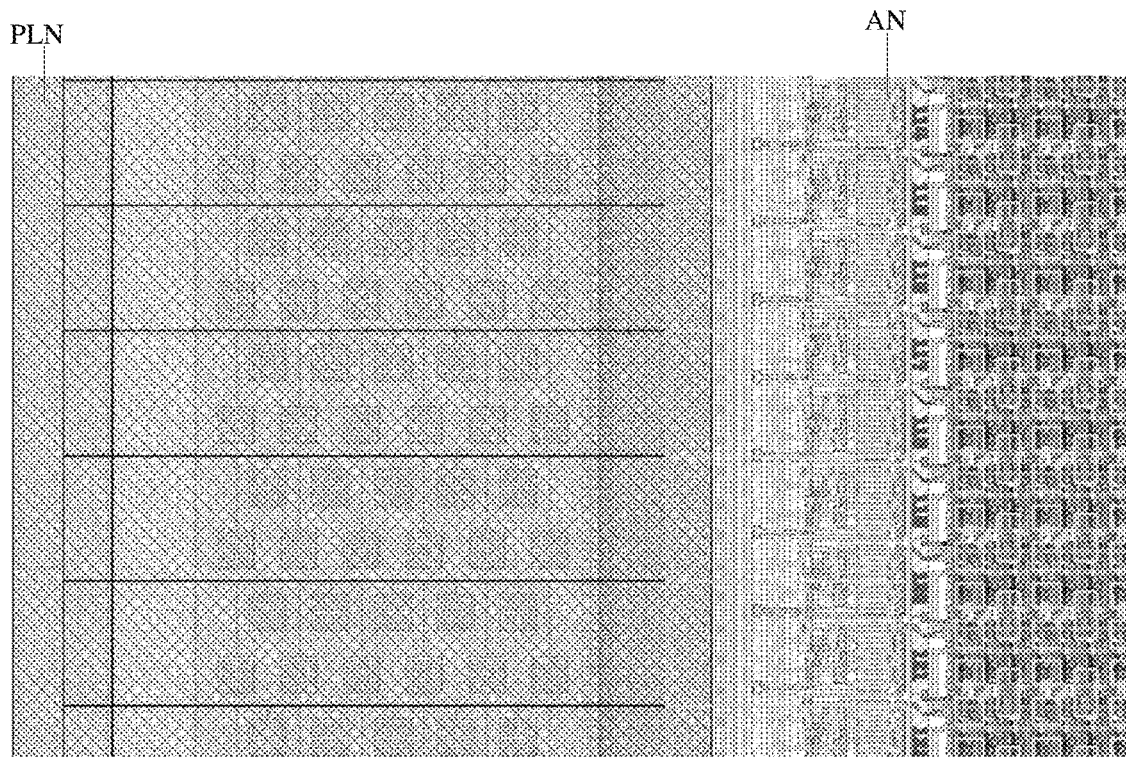
Figure 10F:
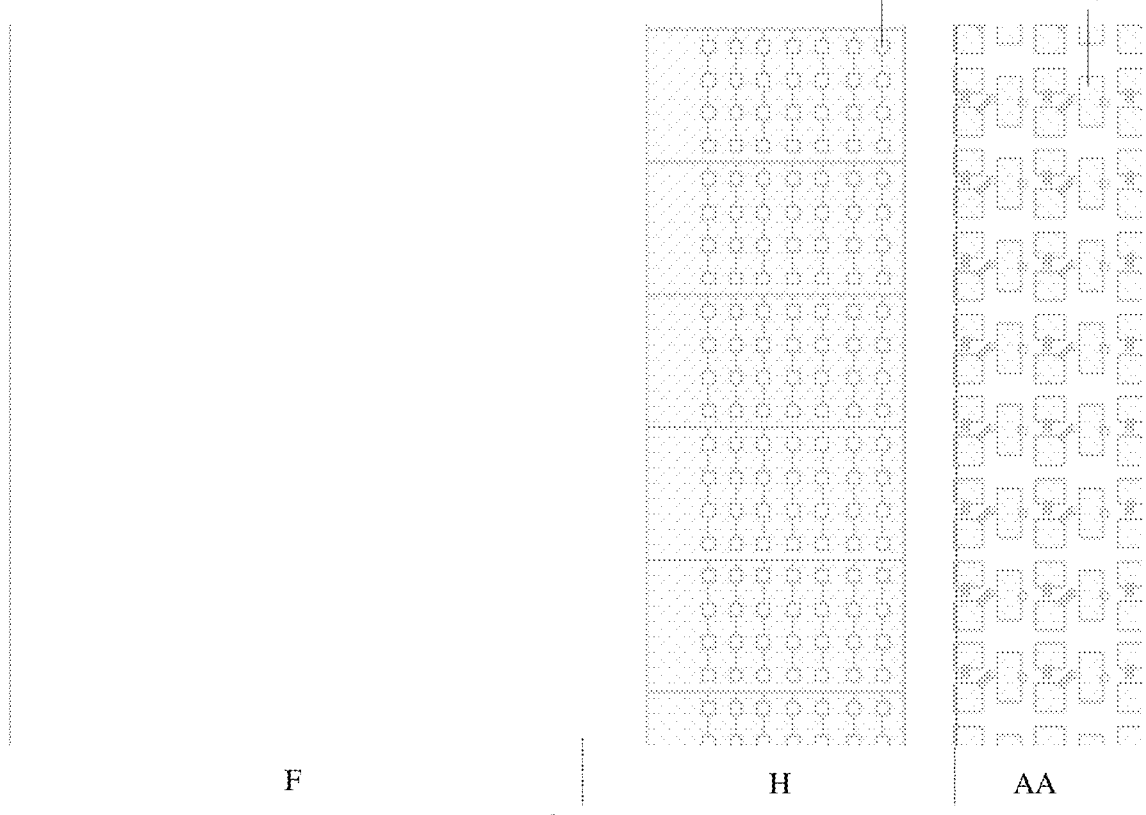

For example, FIG. 9F shows a schematic diagram of stacking an electrode layer on the basis of FIG. 9E, and FIG. 10F shows a schematic diagram of the electrode layer. As illustrated in FIG. 9F and FIG. 10F, the electrode layer AN includes a third electrode layer located in the electrode opening region H and a first electrode layer located in the display region AA. For example, the third electrode layer located in the electrode opening region H includes a plurality of columns of electrode openings 2011 on the side close to the display region AA, and the first electrode layer located in the display region AA includes a plurality of first electrodes AN1 for forming light-emitting elements.

Figure 9G:
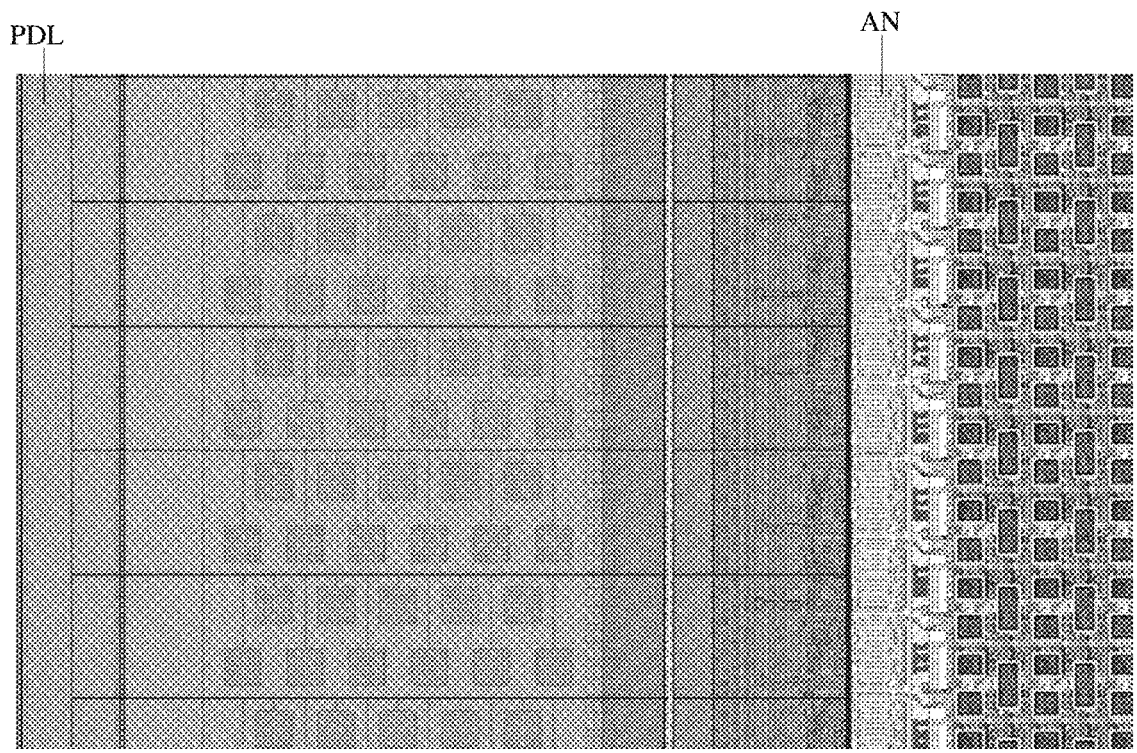
Figure 10G:
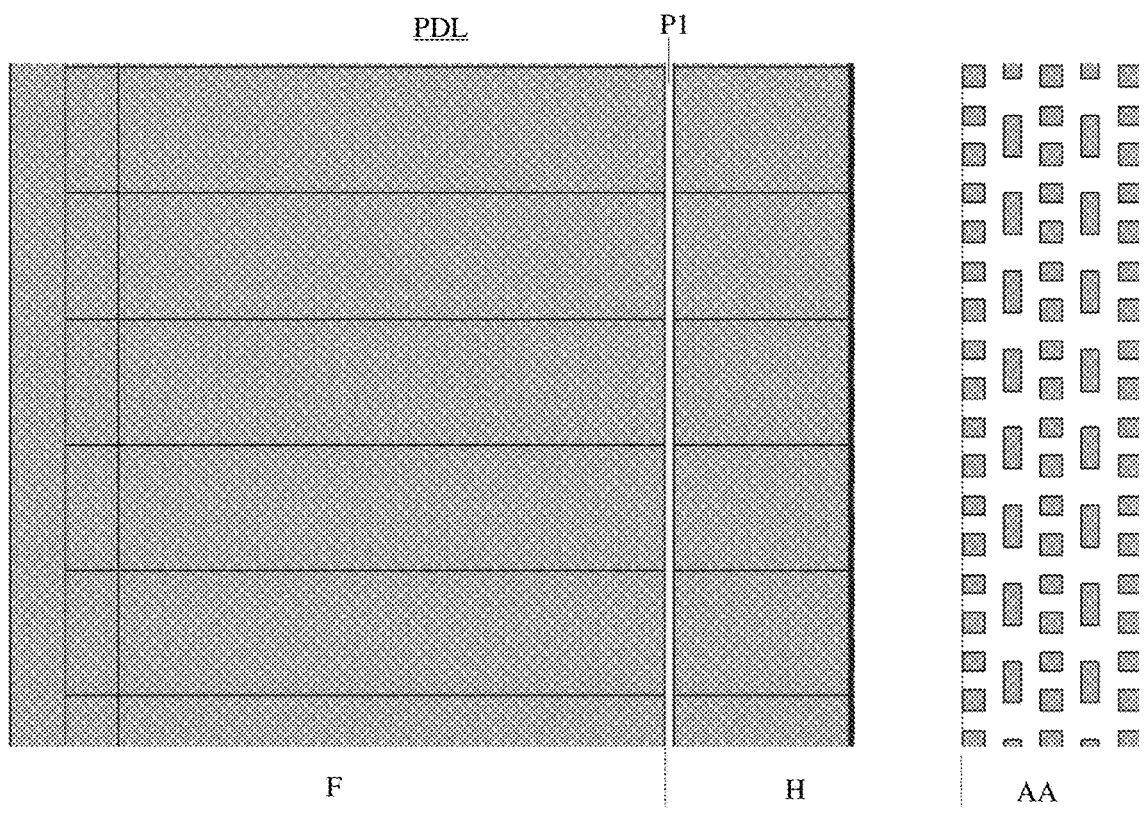

For example, FIG. 9G shows a schematic diagram of stacking a pixel definition layer on the basis of FIG. 9F, and FIG. 10G shows a schematic diagram of the pixel definition layer. As illustrated in FIG. 9G and FIG. 10G, the shaded part in the figure is the part where the pixel definition layer PDL is not provided, and the pixel definition layer PDL extends to the electrode opening region H and covers a part of the third electrode layer (the part close to the display region AA) and at least one column of the plurality of columns of electrode openings (such as two columns of electrode openings close to the display region AA in FIG. 10F). For example, the light-emitting layer (not shown in the figure) is arranged on the part of the pixel definition layer PDL located in the electrode opening region H.

For example, at the edge of the electrode(anode) opening region H close to the encapsulation region F, the pixel definition layer PDL includes an elongated portion P1, and the third electrode layer is covered by the elongated portion P1.

Figure 9H:
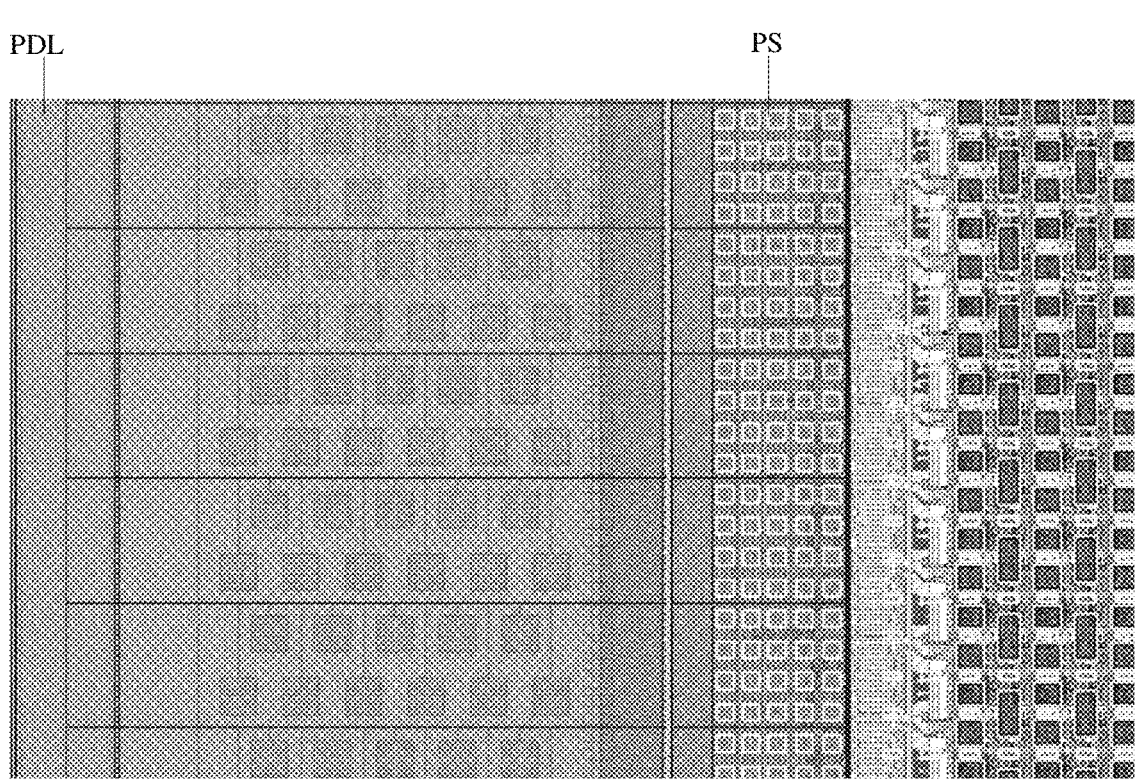
Figure 10H:
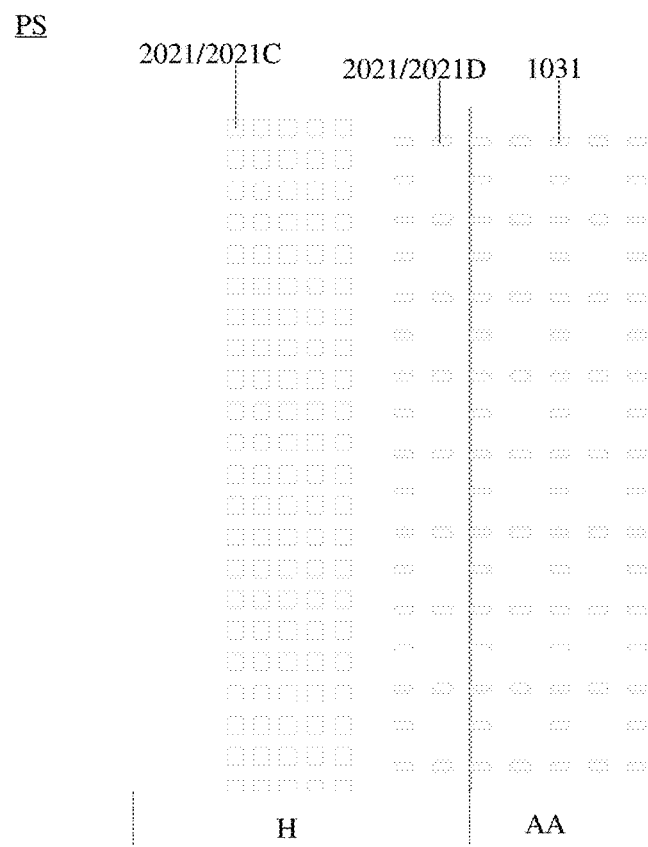

For example, FIG. 9H shows a schematic diagram of stacking a spacer layer on the basis of FIG. 9G, and FIG. 10H shows a schematic diagram of the spacer layer. As illustrated in FIG. 9H and FIG. 10H, the spacer layer PS includes a plurality of spacers 1031 disposed in the display region AA and a plurality of insulating patterns 2021 disposed in the electrode opening region H. That is, in this embodiment, the plurality of insulating patterns 2021 in the electrode opening region H and the plurality of spacers 1031 in the display region AA are formed in the same layer.

For example, in the electrode(anode) opening region H, the sizes and shapes of the plurality of insulating patterns 2021D (that is, two columns of insulating patterns on the right side of the electrode opening region H in the figure) provided on the side of the pixel definition layer covering the third electrode layer away from the base substrate are the same as the sizes and shapes of the plurality of spacers 1031 in the display region AA, for example, the shape is a rectangle. For example, the arrangement of the plurality of insulating patterns 2021D provided on the side of the pixel definition layer covering the third electrode layer away from the base substrate is the same as the arrangement of the plurality of spacers 1031 in the display region AA.

For example, the sizes and shapes of the plurality of insulating patterns 2021C provided on the other (the remaining) columns of electrode openings which are not covered by the pixel definition layer (that is, five columns of insulating patterns on the left side of the electrode opening region H in the figure) are different from the sizes and shapes of the plurality of spacers 1031 in the display region, and for example, the plurality of insulating patterns 2021C are in the shape of a square. That is, the arrangement of the plurality of insulating patterns 2021C disposed on the other (the remaining) columns of electrode openings which are not covered by the pixel definition layer is different from the arrangement of the plurality of spacers 1031 in the display region AA.

For example, in the column direction, the sizes (i.e., the vertical direction in the figure) of the plurality of insulating patterns 2021C disposed on the other (the remaining) columns of electrode openings not covered by the pixel definition layer are larger than the sizes of the plurality of spacers 1031 in the display region AA.

For example, in the column direction, among the plurality of insulating patterns 2021C disposed on the other (the remaining) columns of electrode openings not covered by the pixel definition layer, the distance between two adjacent insulating patterns is smaller than the distance between two adjacent spacers 1031 among the plurality of spacers 1031 in the display region.

For example, in the row direction (i.e., the horizontal direction in the figure), the sizes of the plurality of insulating patterns 2021C disposed on the remaining columns of electrode openings not covered by the pixel definition layer are smaller than or equal to the sizes of the plurality of spacers 1031 in the display region AA.

For example, among the plurality of insulating patterns 2021C provided on the remaining columns of electrode openings not covered by the pixel definition layer, in the row direction, the distance between two adjacent insulating patterns 2021C is smaller than or equal to the distance between two adjacent spacers 1031 among the plurality of spacers 1031 in the display region.

Through the above-mentioned design of the plurality of insulating patterns 2021, the plurality of insulating patterns 2021 can effectively discharge impurities such as gas that may be generated in the manufacturing process of the film layer below them, so as to improve the production yield of the display substrate and improve the reliability of the display substrate.

For example, on the spacer layer, the display substrate is further formed with functional layers such as a light-emitting layer, a second electrode layer, and an encapsulation layer. The specific forms of these functional layers can be referred to related technologies, and will not be repeated here.

At least one embodiment of the present disclosure further provides a display panel, and the display panel includes any one of the above-mentioned display substrates. For example, the display panel further includes a cover plate, and the cover plate is combined with the display substrate through an encapsulation glue 302. For another example, the display panel may further include a driver chip (IC), etc., and may also include a communication device as needed. The display panel has good encapsulation effect and display effect, and also has all the technical effects of the above-mentioned display substrate, which will not be repeated here.

At least one embodiment of the present disclosure further provides a display device, and the display device includes the above-mentioned display panel. For example, the display device may be a wearable display device. For example, the wearable display device includes any wearable display device such as a watch, a sports bracelet, etc.

For example, the display device may also be any product or component with a display function, such as a mobile phone, a tablet computer, a television, a monitor, a notebook computer, a digital photo frame, a navigator, etc. The specific form of the display device is not limited in the embodiments of the present disclosure.

At least one embodiment of the present disclosure further provides a manufacturing method of a display substrate, the display substrate includes a display region, an encapsulation region surrounding the display region, and an electrode opening region between the display region and the encapsulation region, and the manufacturing method includes: providing a base substrate; in the display region, forming a pixel driving circuit on the base substrate, and sequentially forming a first planarization layer, a first electrode layer, a pixel definition layer, a spacer layer, a light-emitting layer, and a second electrode layer on a side of the pixel driving circuit away from the base substrate along a direction away from the base substrate, in which the first electrode layer comprises a plurality of first electrodes, the pixel definition layer comprises a plurality of sub-pixel openings, and each of the plurality of sub-pixel opening exposes one first electrode; and in the electrode opening region, sequentially forming a second planarization layer, a third electrode layer, and a spaced insulating layer along the direction away from the base substrate, in which the third electrode layer comprises a plurality of electrode openings spaced apart from each other, the spaced insulating layer comprises a plurality of insulating patterns spaced apart from each other, each of the plurality of insulating pattern fills a corresponding electrode opening, and an orthographic projection of the each of the plurality of insulating pattern on the base substrate covers an orthographic projection of the corresponding electrode opening on the base substrate. A maximum distance between a side of the spaced insulating layer away from the base substrate and the base substrate is a first distance, a maximum distance between a side of the spacer layer away from the base substrate and the base substrate is a second distance, and a ratio of the first distance to the second distance ranges from 0.9 to 1.1.

For example, the spaced insulating layer includes a first layer and a second layer which are sequentially arranged in the direction away from the base substrate. With respect to the base substrate, both the first layer and the second layer are formed in the same layer as the spacer layer; or the first layer is formed in the same layer as the pixel definition layer, and the second layer is formed in the same layer as the spacer layer.

In the embodiments of the present disclosure, "in the same layer" means that in the manufacturing process of the display substrate, two or more functional layers or structural layers can be formed of the same material layer, and the desired patterns and structures can be formed through the same patterning process.

For example, the manufacturing method of the display substrate further includes: in the electrode opening region, forming the gate driving circuit on the base substrate and forming the above-mentioned second planarization layer on the side of the gate driving circuit away from the base substrate, in which the third electrode layer is formed on the side of the second planarization layer away from the base substrate, and the plurality of electrode openings expose the second planarization layer.

For example, the gate driving circuit and the pixel driving circuit layer are formed at least partially in the same layer.

For example, the manufacturing method of the display substrate further includes: forming the power line, such as a VSS power line, on the base substrate, in which the third electrode layer extends to the side of the power line away from the base substrate to be connected with the power line. For example, the above-mentioned power line is formed in the same layer as part of the circuits of the gate driving circuit (or the pixel driving circuit in the pixel driving circuit layer), for example, in the same layer as the source and drain electrodes of the thin film transistor of the gate driving circuit (or the pixel driving circuit).

For example, the manufacturing method of the display substrate further includes: in the encapsulation region, forming the encapsulation base on the base substrate and forming the encapsulation glue on the side of the encapsulation base away from the base substrate. For example, the material of the encapsulation base includes metal. For example, the encapsulation base is formed in the same layer as part of the circuits of the gate driving circuit (or the pixel driving circuit in the pixel driving circuit layer), for example, in the same layer as the gate electrode of the thin film transistor of the gate driving circuit (or the pixel driving circuit).

For example, referring to FIG. 4 to FIG. 6, the manufacturing method of the display substrate provided by the embodiments of the present disclosure is exemplarily introduced.

Firstly, the base substrate 101 is provided, the barrier layer 1112 and the buffer layer 1013 are sequentially formed on the base substrate 101 by the process such as deposition or sputtering, and then the gate driving circuit G in the electrode opening region H and the pixel driving circuit layer D in the display region AA are formed in the same layer, which may include sequentially forming functional layers of thin film transistors and storage capacitors of the gate driving circuit and the pixel driving circuit by patterning processes. For example, the active layer 1021, the first gate insulating layer 1014A, the gate electrode 1022 (and the first capacitor plate 1031), the second gate insulating layer 1014B, the second capacitor plate 1032, the first interlayer insulating layer 1015, and source and drain electrodes 1023 and 1024 are sequentially formed. For example, one patterning process includes photoresist coating, exposure, development, etching, etc.

For example, when the first gate insulating layer 1014A is formed, the insulating layer 303 is formed in the encapsulation region F at the same time, that is, the first gate insulating layer 1014A and the insulating layer 303 are formed in the same layer; and when the gate electrode of the thin film transistor is formed, the same process is used to simultaneously form the encapsulation base 301 in the encapsulation region F, that is, the gate electrode of the thin film transistor is formed in the same layer as the encapsulation base 301.

After that, the first planarization layer 1016 is formed by a patterning process, and then the first electrode layer EM1 and the third electrode layer 201 are formed in the same layer, that is, the first electrode layer EM1 and the third electrode layer 201 are formed by the same patterning process using the same material layer. The first electrode layer EM1 includes a plurality of first electrodes EM11, each first electrode EM11 is electrically connected to the corresponding thin film transistor through a via in the first planarization layer 1016, and the third electrode layer 201 includes a plurality of electrode openings 2021.

For example, in some embodiments, the spaced insulating layer 202 and the spacer layer 103 are formed in the same layer. In this case, a patterning process is used to form the pixel definition layer 102 on the first electrode layer EM1, the pixel definition layer 102 includes a plurality of sub-pixel openings, each sub-pixel opening exposes the first electrode EM11, and then the spacer layer 103 and the spaced insulating layer 202 are formed in the same layer, that is, the same material layer is used to form the spacer layer 103 on the pixel definition layer 102 and the spaced insulating layer 202 on the third electrode layer 201 through the same patterning process. Then, the encapsulation glue 302 is coated on the encapsulation base 301, a mask is used to form the light-emitting layer EM2 in each sub-pixel opening by evaporation or inkjet printing of organic light-emitting materials, and then a deposition or sputtering process is used to form the second electrode layer EM3.

For example, in other embodiments, the spaced insulating layer 202 includes the first layer and the second layer, the first layer is formed in the same layer as the pixel definition layer 102, and the second layer is formed in the same layer as the spacer layer 103. In this case, after the first electrode layer EM1 and the third electrode layer 201 are formed in the same layer, the first layer of the spaced insulating layer 202 and the pixel definition layer 102 are formed in the same layer, and then the second layer of the spaced insulating layer 202 and the spacer layer 103 are formed in the same layer. Then, the encapsulation glue 302 is coated on the encapsulation base 301, and the light-emitting layer EM2 is formed in each sub-pixel opening by means of evaporation or inkjet printing of organic light-emitting materials using a mask, and the second electrode layer EM3 is formed by a process such as deposition or sputtering. In this embodiment, the spaced insulating layer 202 has a higher height to fully realize the support function.

In addition, after the above process is completed, the manufacturing process of the display substrate may further include forming an encapsulation layer in the display region and the electrode opening region to encapsulate the gate driving circuit G, the light-emitting element, etc. The embodiments of the present disclosure do not specifically limit other manufacturing processes of the display substrate.

In the manufacturing method of the display substrate provided by the embodiments of the present disclosure, a ratio of a maximum distance, between a side of the spaced insulating layer away from the base substrate and the base substrate, to a maximum distance, between a side of the spacer layer away from the base substrate and the base substrate, ranges from 0.9 to 1.1, that is, the height of the spaced insulating layer with respect to the base substrate is similar to or substantially the same as the height of the spacer layer with respect to the base substrate. For example, in some embodiments, the spaced insulating layer in the electrode opening region is formed at least in the same layer as the spacer layer in the display region, so that the manufacturing process of the display substrate is simplified, and at the same time, the formed spaced insulating layer has a sufficient height, which can serve as a mask support layer in the electrode opening region. When the mask is used to form the organic light-emitting layer of the light-emitting element by means of evaporation or the like, the mask can be uniformly supported on the spaced insulating layer in the electrode opening region, the spacer layer in the display region, and the encapsulation glue in the encapsulation region, so as to improve the force uniformity of the mask in each region of the display substrate and further improve the force uniformity of the encapsulation glue and the flatness of the mask, thereby avoiding the occurrence of defects such as Newton rings, color shift, or the like, and improving the production yield of the display substrate.

The following statements should be noted.

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, comprising a base substrate and having a display region, an encapsulation region surrounding the display region, and an electrode opening region between the display region and the encapsulation region, wherein the display region comprises a pixel driving circuit on the base substrate, and comprises a first planarization layer, a first electrode layer, a pixel definition layer, a spacer layer, a light-emitting layer, and a second electrode layer which are on a side of the pixel driving circuit away from the base substrate, the first electrode layer comprises a plurality of first electrodes, the pixel definition layer comprises a plurality of sub-pixel openings, and each of the plurality of sub-pixel openings exposes one first electrode of the plurality of first electrodes;

the electrode opening region comprises a second planarization layer, a third electrode layer, and a spaced insulating layer which are sequentially arranged along the direction away from the base substrate, the third electrode layer comprises a plurality of electrode openings spaced apart from each other, the spaced insulating layer comprises a plurality of insulating patterns spaced apart from each other, each of the plurality of insulating patterns fills a corresponding electrode opening of the plurality of electrode openings, and an orthographic projection of the each of the plurality of insulating patterns on the base substrate covers an orthographic projection of the corresponding electrode opening on the base substrate; and a maximum distance between a side of the spaced insulating layer away from the base substrate and the base substrate is a first distance, a maximum distance between a side of the spacer layer away from the base substrate and the base substrate is a second distance, and a ratio of the first distance to the second distance ranges from 0.9 to 1.1;

at least part of the spaced insulating layer is in a same layer as the spacer layer;

the spacer layer comprises a plurality of spacers arranged in an array in the display region, heights of the plurality of insulating patterns in the spaced insulating layer and the plurality of spacers in the spacer layer in a direction perpendicular to the base substrate range from 1.5 μm to 2.5 μm;

the third electrode layer of the electrode opening region comprises a plurality of columns of electrode openings on a side close to the display region, the pixel definition layer extends to the electrode opening region and covers a part of the third electrode layer and at least one column of electrode openings in the plurality of columns of electrode openings, the light-emitting layer is on a side of a part of the pixel definition layer in the electrode opening region away from the base substrate;

sizes and shapes of the plurality of insulating patterns on a side of the pixel definition layer covering the third electrode layer away from the base substrate are identical to sizes and shapes of the plurality of spacers in the display region, and sizes and shapes of the plurality of insulating patterns on other columns of electrode openings not covered by the pixel definition layer are different from the sizes and the shapes of the plurality of spacers in the display region;

in a column direction, the sizes of the plurality of insulating patterns on the other columns of electrode openings not covered by the pixel definition layer are larger than the sizes of the plurality of spacers in the display region, and in the column direction, a distance between two adjacent insulating patterns in the plurality of insulating patterns on the other columns of electrode openings not covered by the pixel definition layer is smaller than a distance between two adjacent spacers in the plurality of spacers in the display region.

2. The display substrate according to claim 1, wherein the spaced insulating layer comprises a first layer and a second layer which are sequentially arranged along the direction away from the base substrate, and with respect to the base substrate, at least one layer of the spaced insulating layer is in a same layer as the spacer layer.

3. The display substrate according to claim 2, wherein the at least one layer of the spaced insulating layer being in the same layer as the spacer layer comprises:

both the first layer and the second layer being in a same layer as the spacer layer; or the first layer being in a same layer as the pixel definition layer, and the second layer being in a same layer as the spacer layer.

4. The display substrate according to claim 1, wherein the electrode opening region further comprises a gate driving circuit on a side of the second planarization layer close to the base substrate, the plurality of electrode openings expose the second planarization layer.

5. The display substrate according to claim 4, wherein the second electrode layer is continuously provided in the display region and extends from the display region to the electrode opening region, and the second electrode layer is connected to the third electrode layer through a gap between the plurality of insulating patterns in the electrode opening region.

6. The display substrate according to claim 5, wherein the electrode opening region further comprises a VSS power line on the base substrate, and the third electrode layer extends to a side of the VSS power line away from the base substrate to be connected to the VSS power line.

7. The display substrate according to claim 6, wherein the VSS power line is in a same layer as part of circuits of the gate driving circuit, and is on a side of the gate driving circuit away from the display region.

8. The display substrate according to claim 1, wherein at an edge of the electrode opening region close to the encapsulation region, the pixel definition layer comprises an elongated portion, and the third electrode layer is covered by the elongated portion.

9. The display substrate according to claim 1, wherein an angle of a tangent of a side surface of each of the plurality of insulating patterns between a surface of the each of the plurality of insulating patterns close to the base substrate and a surface of the each of the plurality of insulating patterns away from the base substrate, and a plane parallel to the base substrate ranges from 10° to 60°.

10. The display substrate according to claim 6, wherein the encapsulation region comprises an encapsulation base, an interlayer insulating layer, and an encapsulation glue which are sequentially arranged along the direction away from the base substrate.

11. The display substrate according to claim 10, wherein a material of the encapsulation base comprises metal, the encapsulation base is in a first gate metal layer and comprises a plurality of first openings spaced apart from each other, the interlayer insulating layer comprises a plurality of groups of second openings, and each of the plurality of groups of second openings comprises a plurality of second openings spaced apart from each other.

12. The display substrate according to claim 11, wherein an orthographic projection of each of the plurality of groups of second openings on the base substrate is within a range of an orthographic projection of a corresponding first opening on the base substrate, and the encapsulation glue is in the plurality of first openings and the plurality of second openings.

13. The display substrate according to claim 11, wherein a plurality of protrusions spaced apart from each other are provided on an edge of the encapsulation base close to the electrode opening region, and the plurality of protrusions are connected to the VSS power line through vias in the interlayer insulating layer.

14. The display substrate according to claim 10, wherein a ratio of a distance, between a surface of the encapsulation glue away from the base substrate and the base substrate, to a distance, between a surface of the plurality of insulating patterns in the spaced insulating layer away from the base substrate and the base substrate, ranges from 1.2 to 0.8.

15. A display device, comprising the display substrate according to claim 1.

16. A manufacturing method of a display substrate, wherein the display substrate has a display region, an encapsulation region surrounding the display region, and an electrode opening region between the display region and the encapsulation region, and the manufacturing method comprises:

provides a base substrate;

in the display region, forming a pixel driving circuit on the base substrate, and sequentially forming a first planarization layer, a first electrode layer, a pixel definition layer, a spacer layer, a light-emitting layer, and a second electrode layer on a side of the pixel driving circuit away from the base substrate, wherein the first electrode layer comprises a plurality of first electrodes, the pixel definition layer comprises a plurality of sub-pixel openings, and each of the plurality of sub-pixel openings exposes one first electrode of the plurality of first electrodes; and in the electrode opening region, sequentially forming a second planarization layer, a third electrode layer, and a spaced insulating layer along the direction away from the base substrate, wherein the third electrode layer comprises a plurality of electrode openings spaced apart from each other, the spaced insulating layer comprises a plurality of insulating patterns spaced apart from each other, each of the plurality of insulating patterns fills a corresponding electrode opening of the plurality of insulating patterns, and an orthographic projection of the each of the plurality of insulating patterns on the base substrate covers an orthographic projection of the corresponding electrode opening on the base substrate, wherein a maximum distance between a side of the spaced insulating layer away from the base substrate and the base substrate is a first distance, a maximum distance between a side of the spacer layer away from the base substrate and the base substrate is a second distance, and a ratio of the first distance to the second distance ranges from 0.9 to 1.1;

at least part of the spaced insulating layer is in a same layer as the spacer layer;

the spacer layer comprises a plurality of spacers arranged in an array in the display region, heights of the plurality of insulating patterns in the spaced insulating layer and the plurality of spacers in the spacer layer in a direction perpendicular to the base substrate range from 1.5 µm to 2.5 µm;

the third electrode layer of the electrode opening region comprises a plurality of columns of electrode openings on a side close to the display region, the pixel definition layer extends to the electrode opening region and covers a part of the third electrode layer and at least one column of electrode openings in the plurality of columns of electrode openings, the light-emitting layer is on a side of a part of the pixel definition layer in the electrode opening region away from the base substrate;

sizes and shapes of the plurality of insulating patterns on a side of the pixel definition layer covering the third electrode layer away from the base substrate are identical to sizes and shapes of the plurality of spacers in the display region, and sizes and shapes of the plurality of insulating patterns on other columns of electrode openings not covered by the pixel definition layer are different from the sizes and the shapes of the plurality of spacers in the display region;

in a column direction, the sizes of the plurality of insulating patterns on the other columns of electrode openings not covered by the pixel definition layer are larger than the sizes of the plurality of spacers in the display region, and in the column direction, a distance between two adjacent insulating patterns in the plurality of insulating patterns on the other columns of electrode openings not covered by the pixel definition layer is smaller than a distance between two adjacent spacers in the plurality of spacers in the display region.

* * * * *